United States Patent
Bolotin et al.

(10) Patent No.: US 9,236,702 B2
(45) Date of Patent: *Jan. 12, 2016

(54) FOLDABLE ELECTRICAL CONNECTOR-HOUSING SYSTEM AND METHOD OF MANUFACTURE THEREOF

(71) Applicant: ClevX, LLC, Kirkland, WA (US)

(72) Inventors: Lev M. Bolotin, Kirkland, WA (US); Robert B. Hubler, Woodinville, WA (US)

(73) Assignee: ClevX, LLC, Kirkland, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/503,231

(22) Filed: Sep. 30, 2014

(65) Prior Publication Data

US 2015/0017819 A1    Jan. 15, 2015

Related U.S. Application Data

(63) Continuation-in-part of application No. 14/022,162, filed on Sep. 9, 2013, now Pat. No. 9,013,885, which is a continuation of application No. 12/583,251, filed on Aug. 17, 2009, now Pat. No. 8,531,843.

(60) Provisional application No. 61/089,494, filed on Aug. 15, 2008.

(51) Int. Cl.
  *H05K 1/00* (2006.01)
  *H01R 43/18* (2006.01)
  *H05K 5/02* (2006.01)

(52) U.S. Cl.
  CPC .............. *H01R 43/18* (2013.01); *H05K 5/0278* (2013.01); *Y10T 29/49169* (2015.01)

(58) Field of Classification Search
  USPC .............................. 361/749, 752, 757; 439/31
  See application file for complete search history.

(56) References Cited

U.S. PATENT DOCUMENTS

| | | | |
|---|---|---|---|
| 5,452,182 A | 9/1995 | Eichelberger et al. | |
| 5,631,446 A * | 5/1997 | Quan | H01R 12/62 174/254 |
| 5,703,755 A | 12/1997 | Flesher et al. | |
| 5,858,568 A | 1/1999 | Hsu et al. | |
| 5,917,149 A | 6/1999 | Barcley et al. | |
| 6,307,751 B1 | 10/2001 | Bodony et al. | |
| 6,733,329 B2 | 5/2004 | Yang | |
| 6,841,739 B2 | 1/2005 | Moore | |
| 6,883,718 B1 | 4/2005 | Le et al. | |
| 6,908,038 B1 | 6/2005 | Le | |
| 7,124,238 B2 | 10/2006 | Hong | |
| 7,145,411 B1 * | 12/2006 | Blair | H01P 3/006 333/247 |
| 7,265,719 B1 | 9/2007 | Moosbrugger et al. | |
| 7,344,072 B2 | 3/2008 | Gonzalez et al. | |
| 7,537,169 B2 | 5/2009 | Gonzalez et al. | |
| D603,812 S | 11/2009 | Johnson et al. | |
| D607,886 S | 1/2010 | Bolotin et al. | |
| D631,058 S | 1/2011 | Chin et al. | |
| D670,712 S | 11/2012 | Bolotin et al. | |
| 2007/0070611 A1 | 3/2007 | Koh | |
| 2007/0243769 A1 | 10/2007 | Atsmon et al. | |
| 2013/0083464 A1 | 4/2013 | Becze et al. | |

* cited by examiner

*Primary Examiner* — Andargie M Aychillhum
(74) *Attorney, Agent, or Firm* — Ishimaru & Associates LLP

(57) ABSTRACT

A system and method of manufacture of a foldable electrical connector-housing system includes: a first end panel with an outer first end panel side having first end panel contacts; a second end panel having an outer second end panel side; a clip mechanism in at least one of the two end panels for attaching the foldable electrical connector-housing system to a flat surface; a fold mechanism is connected between the first end panel and the second end panel for folding into a folded configuration; and an electronic unit on the first end panel, the electronic unit coupled to the first end panel contacts.

9 Claims, 10 Drawing Sheets

FOLDABLE ELECTRICAL CONNECTOR-HOUSING SYSTEM AND METHOD OF MANUFACTURE THEREOF

CROSS-REFERENCE TO RELATED APPLICATION(S)

This is a continuation-in-part of co-pending U.S. patent application Ser. No. 14/022,162, filed Sep. 9, 2013, which is a continuation of U.S. patent application Ser. No. 12/583,251, filed Aug. 17, 2009, now U.S. Pat. No. 8,531,843 B2, which claims the benefit of U.S. Provisional Patent Application Ser. No. 61/089,494, filed Aug. 15, 2008, and the subject matter thereof is incorporated herein by reference thereto.

TECHNICAL FIELD

The present invention relates generally to an electrical housing, and more particularly, to system for an electrical connector with a housing of minimal thickness.

BACKGROUND ART

Products must compete in world markets and attract many consumers or buyers in order to be successful. A number of manufacturers produce electronic systems, such as Flash based media (e.g. storage, MP3 players, etc.), in credit card style or smaller sizes. There are many problems associated with these electronic systems that are size related. A considerable amount of effort has been applied to solving this issue.

One problem with these systems is electrical connection related. For example, a flash drive or MP3 player can require a Universal Serial Bus (USB) electrical connection. A standard A-type USB connection requires a connector that is approximately 12 millimeters (mm)×2.2 mm in size if implemented without a metal frame and 12 mm×4.5 mm with a standard metal frame.

The desired outcome of being able to store an electronic device with a USB connector in a small personal space becomes hindered as thickness and rigidity of the housing body make it difficult to fit in a small personal space.

In addition, current solutions have additional bulk and rigidity that make carrying in a small personal space (like a typical American wallet) less convenient than the more pliable credit card.

One solution has been to provide an approximately 2-2.5 mm thick card with a protruding "arm" containing contacts that act as the male side of a USB connector. However, this provides a bulky housing and potentially a relatively fragile connector that "sticks out".

Other solutions have been proposed that maintain the card shape and expose the male connector by folding, pivoting, or sliding out a portion of the card. All these solutions require that some portion of the housing be of sufficient thickness to mate with a USB female connector.

The standard size for credit cards, business cards, etc. is about 55 mm×85 mm×1 mm which is incompatible with a female USB connector.

Thus, a need exists to create an electrical housing compatible with small personal spaces, such as wallets and the like. In view of the ever-increasing commercial competitive pressures and consumer expectation, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of a foldable electrical connector-housing system including: providing a first end panel with an outer first end panel side having first end panel contacts; providing a second end panel having an outer second end panel side; forming a clip mechanism in at least one of the two end panels for attaching the foldable electrical connector-housing system to a flat surface; providing a fold mechanism connected between the first end panel and the second end panel for folding into a folded configuration; and attaching an electronic unit on the first end panel, the electronic unit coupled to the first end panel contacts.

The present invention provides a foldable electrical connector-housing system including: a first end panel with an outer first end panel side having first end panel contacts; a second end panel having an outer second end panel side; a clip mechanism in at least one of the two end panels for attaching the foldable electrical connector-housing system to a flat surface; a fold mechanism is connected between the first end panel and the second end panel for folding into a folded configuration; and an electronic unit on the first end panel, the electronic unit coupled to the first end panel contacts.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
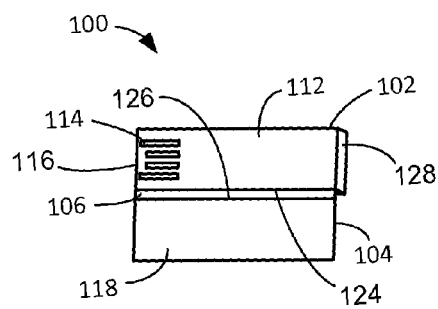
FIG. 1 is an orthogonal view of a foldable electrical connector-housing system in an open configuration of a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown an orthogonal view of a foldable electrical connector-housing system 100 in an open configuration of a first embodiment of the present invention. The open configuration can be used for transporting or storing of the foldable electrical connector-housing system 100.

The present embodiment can preferably include a first end panel 102, a second end panel 104, and a fold mechanism 106. The first end panel 102, such as a panel, leaf, or board, can be formed from a non-conductive material having a rigid, a semi-pliable, a flexible, or a combination of characteristics thereof. The first end panel 102 can include a predetermined thickness based on user requirements such as physical constraints, product features, or production needs.

The second end panel 104 can be similar to the first end panel 102. The second end panel 104 can include a predetermined thickness identical or different from the predetermined thickness of the first end panel 102. The predetermined thickness of the second end panel 104 is chosen to meet specific requirements of the user such as physical constraints, product features, or production needs.

For purposes of illustration, the first end panel 102 and the second end panel 104 are shown in a shape of a rectangle although the first end panel 102 or the second end panel 104 may be of any shape, size or different from one another.

First end panel contacts 114 of the first end panel 102 can substantially span from one edge of an outer first end panel side 112 to an opposite edge of the outer first end panel side 112. The first end panel contacts 114 can provide electrical connectivity to an electronic component, such as memory circuitry, and an external connector, subsystem, or system.

The outer first end panel side 112 of the first end panel 102 can preferably include the first end panel contacts 114, such as lead fingers, pads, balls, or bumps, substantially exposed on and coplanar with the outer first end panel side 112. The first end panel contacts 114 can preferably be formed closest to a short first end edge 116 of the first end panel.

For purposes of illustration, the first end panel contacts 114 are shown next to one edge of the outer first end panel side 112, although the first end panel contacts 114 can be of any number, in any location, on any side, in any number of locations, next to any edge, or have a spacing from any edge.

The fold mechanism 106 such as a hinge, live-hinge, flexible section, or preformed region, can be formed as a discrete part, integral to the first end panel 102, integral to the second end panel 104, or combination thereof. The fold mechanism 106 can be directly attached to an edge of the first end panel 102 and an edge of the second end panel 104 to provide rotation of both the first end panel 102 and the second end panel 104 about the fold mechanism 106.

The rotation of both the first end panel 102 and the second end panel 104 can provide the outer first end panel side 112 facing away from an outer second end panel side 118. For example, when folded, the outer first end panel side 112 and the outer second end panel side 118 can be substantially exposed and opposite one another.

Furthermore, for example, the fold mechanism 106 can be provided on a long first end edge 124 of the first end panel 102 and a long second end edge 126 of the second end panel 104.

The first end panel 102 and the second end panel 104 can be folded or rotated at the fold mechanism 106 around a central axis line or fold axis line formed along a length of the fold mechanism 106 and can optionally include at least one pin (not shown) such as flexible pin or rigid pin. The pin can preferably be small enough to ensure that any intended rotational movement is substantially unobstructed.

In the open configuration, a plane of the outer first end panel side 112 can be substantially coplanar to a plane of the outer second end panel side 118. Thus, the outer first end panel side 112 and the outer second end panel side 118 can form a substantially flat surface. The substantially flat surface can optionally be printed, labeled, or stamped with images or text.

The present invention can optionally include a spacer 128 such as panel strips, posts, or borders preferably formed of non-conductive material. The spacer 128 can be provided with the first end panel 102 to extend the side opposite the outer first end panel side 112.

The spacer 128 can provide added protection to devices when in the open configuration. The spacer 128 can also separate the first end panel 102 from the second end panel 104 when the present invention is folded or inserted into a mating connector.

It has been discovered that one set of the first end panel contacts 114 can be included next to one of the short first end edge 116 and another set of the first end panel contacts 114 can be included next to another of the short first end edge 116.

Figure 2:
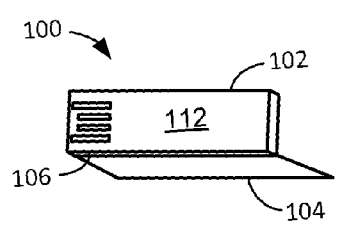
FIG. 2 is the structure of FIG. 1 in a partially folded configuration.

Referring now to FIG. 2, therein is shown the structure of FIG. 1 in a partially folded configuration. The partially folded configuration provides the present invention in a transitional phase, such as during repositioning of the first end panel 102 and the second end panel 104 from the opened configuration to a closed configuration or vice-versa.

The present invention in the partially folded configuration includes characteristics of the first end panel 102 forming an obtuse, right, or acute angle with the second end panel 104 and with the outer first end panel side 112 of the first end panel 102 facing away from the second end panel 104.

The first end panel 102 and the second end panel 104 can preferably fold along the fold mechanism 106 connecting both the first end panel 102 and the second end panel 104. Folding such as half folding can provide the first end panel contacts 114 substantially exposed. The partially folded configuration substantially eliminates direct physical contact between the first end panel 102 and the second end panel 104.

Figure 3:
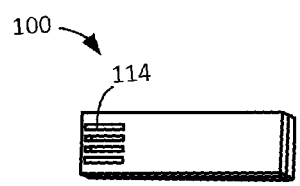
FIG. 3 is the structure of FIG. 1 in a folded configuration.

Referring now to FIG. 3, therein is shown the structure of FIG. 1 in a folded configuration. The folded configuration provides the panels substantially parallel and substantially eliminates spacing between panels or spacers to form a connector-housing.

The first end panel contacts 114 can be substantially exposed to provide connectivity to mating connectors of an electronic subsystem or system such as a computer, security system, data storage facility, or any electronic system having a connector.

For example, the first end panel contacts 114 can be compatible with a female USB port. Further folding the foldable electrical connector-housing system 100 can create a male USB connector. The folded configuration includes a combined thickness that can provide joining with a mating connector such as forming a male connector that is capable of joining with a female connector.

It has been discovered that the present invention with a holding mechanism (not shown) to hold panels or leaves together can also form a female connector for insertion of a male connector of another electronic system or the present invention. The female connector such as an opening, cavity, or hole can provide connectivity or registration for compatibility with mating connectors having protrusions.

It has been found that in another folded configuration, the present invention can be folded with the first end panel contacts 114 directly facing the outer second end panel side 118 for protection of the first end panel contacts 114.

Figure 4:
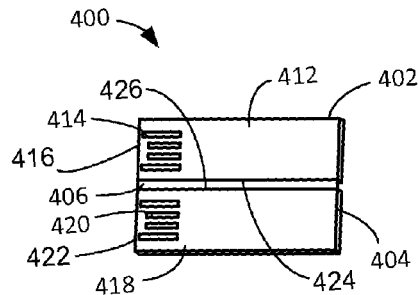
FIG. 4 is an orthogonal view of a foldable electrical connector-housing system in an open configuration of a second embodiment of the present invention.

Referring now to FIG. 4, therein is shown an orthogonal view of a foldable electrical connector-housing system 400 in an open configuration of a second embodiment of the present invention. The open configuration can be used for transporting or storing of the foldable electrical connector-housing system 400.

The present embodiment can preferably include a first end panel 402, a second end panel 404, and a fold mechanism 406. The first end panel 402, such as a panel, leaf, or board, can be formed from a non-conductive material having a rigid, a semi-pliable, a flexible, or a combination of characteristics thereof. The first end panel 402 can include a predetermined thickness based on user requirements such as physical constraints, product features, or production needs.

Similarly, the present invention can include the second end panel 404. The second end panel 404 can include a predetermined thickness identical or different from the predetermined thickness of the first end panel 402. The predetermined thickness of the second end panel 404 is chosen to meet specific requirements of the user such as physical constraints, product features, or production needs.

The fold mechanism 406 such as a hinge, live-hinge, flexible section, or preformed region, can be formed as a discrete part, integral to the first end panel 402, integral to the second end panel 404, or combination thereof. The fold mechanism 406 can be directly attached to an edge of the first end panel 402 and an edge of the second end panel 404 to provide rotation of both the first end panel 402 and the second end panel 404 about the fold mechanism 406.

The first end panel 402 and the second end panel 404 can be folded or rotated at the fold mechanism 406 around a central axis line or fold axis line formed along a length of the fold mechanism 406 and can optionally include at least one pin (not shown) such as flexible pin or rigid pin. The pin can preferably be small enough to ensure that any intended rotational movement is substantially unobstructed.

An outer first end panel side 412 of the first end panel 402 can preferably include first end panel contacts 414, such as lead fingers, pads, balls, or bumps, substantially exposed on and coplanar with the outer first end panel side 412. The first end panel contacts 414 can substantially span from one edge of the outer first end panel side 412 to an opposite edge of the outer first end panel side 412.

The first end panel contacts 414 can be formed closest to a short first end edge 416 of the first end panel 402. The first end panel contacts 414 can provide electrical connectivity to memory circuitry and an external connector, subsystem, or system.

Similarly, an outer second end panel side 418 of the second end panel 404 can preferably include second end panel contacts 420, such as lead fingers, pads, balls, or bumps, substantially exposed on and coplanar with the outer first end panel side 412. The second end panel contacts 420 can substantially span from one edge of the outer second end panel side 418 to an opposite edge of the outer second end panel side 418.

The second end panel contacts 420 can be formed closest to a short second end edge 422 of the second end panel 404. The second end panel contacts 420 can provide electrical connectivity to memory circuitry and an external connector, subsystem, or system.

The short first end edge 416 with the first end panel contacts 414 can be adjacent a long first end edge 424 that can attach to or include a portion of the fold mechanism 406. Similarly, the short second end edge 422 with the second end panel contacts 420 can be adjacent a long second end edge 426 that can attach to or include a portion of the fold mechanism 406.

The foldable electrical connector-housing system 400 can be formed with two panels in an open position and panel contacts on two panels so as to allow connecting to a female connector in either of two orientations.

Figure 5:
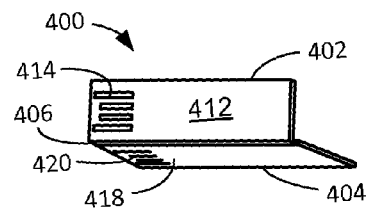
FIG. 5 is the structure of FIG. 4 in a partially folded configuration.

Referring now to FIG. 5, therein is shown the structure of FIG. 4 in a partially folded configuration. The partially folded configuration provides the present invention in a transitional phase, such as during repositioning of the first end panel 402 and the second end panel 404 from the opened configuration to a closed configuration or vice-versa.

The present invention in the partially folded configuration includes characteristics of the first end panel 402 forming an obtuse, right, or acute angle with the second end panel 404 and with the outer first end panel side 412 of the first end panel 402 facing away from the outer second end panel side 418 of the second end panel 404.

The first end panel 402 and the second end panel 404 can preferably fold along the fold mechanism 406 connecting both the first end panel 402 and the second end panel 404. Folding such as half folding can provide the first end panel contacts 414 or the second end panel contacts 420 substantially exposed.

Figure 6:
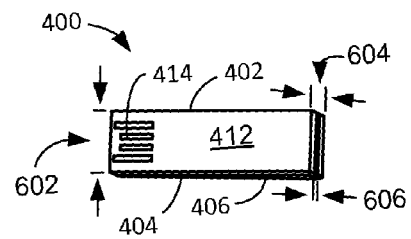
FIG. 6 is the structure of FIG. 4 in a folded configuration.

Referring now to FIG. 6, therein is shown the structure of FIG. 4 in a folded configuration. The folded configuration provides the panels substantially parallel and substantially eliminates spacing between panels to form a connector-housing.

The first end panel contacts 414 and the second end panel contacts 420 of FIG. 5 can be substantially exposed to provide connectivity to mating connectors of an electronic subsystem or system such as a computer, security system, data storage facility, or any electronic system having a connector.

A connector width 602 or a connector thickness 604 of the present invention can be selected to ensure that the present invention can be inserted in the mating connectors of the various electronic systems.

The connector thickness 604 can be defined as a distance from the outer first end panel side 412 to the outer second end panel side 418 of FIG. 5. The connector thickness 604 can also include a spacer height 606 predetermined for providing structural protection such as a crush protection and proper overall dimensional thickness of the foldable electrical connector-housing system 400.

The connector width 602 can be defined as the summation of the width of a panel with any measurable portion of the fold mechanism 406 extending away from an edge of a panel closest to the fold mechanism 406. The connector width 602 or the connector thickness 604 of the present invention can be predetermined to ensure that the present invention can be inserted in the mating connectors of the various electronic systems.

For example, the connector thickness 604 with panels having substantially uniform thickness can be calculated using the following formula:

$$CT = (1+N) * MT$$

where CT=the connector thickness 604, N=the number of folds, and MT=the material thickness of each panel.

For example, a flash drive requires a Universal Serial Bus (USB) electrical connection. A USB connection requires a connector that is approximately 12 mm×2 mm in size. It has been discovered that by folding a credit card-sized foldable electrical connector-housing system, which is approximately 48 mm×85 mm×0.50 mm, at three flexible hinge locations, a proper thickness USB connector may be formed.

The foldable electrical connector-housing system 400 can be folded and connected to a female USB connector in accordance with various embodiments of the present invention. The foldable electrical connector-housing system 400 can be composed of two leaves that are shown in a juxtaposed position in the folded state. The combined thickness of the two leaves make it compatible with the receptacle of a female connector. The desired thickness creates enough pressure, when inserted, to press the first end panel contacts 414 or the second end panel contacts 420 against connectors of the female connector.

Figure 7:
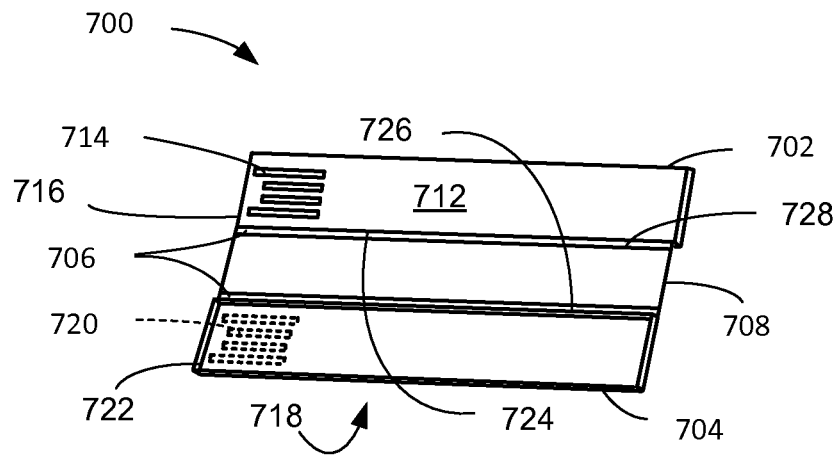
FIG. 7 is an orthogonal view of a foldable electrical connector-housing system in an open configuration of a third embodiment of the present invention.

Referring now to FIG. 7, therein is shown an orthogonal view of a foldable electrical connector-housing system 700 in an open configuration of a third embodiment of the present invention. The open configuration can be used for transporting or storing of the foldable electrical connector-housing system 700.

The present invention in the open configuration can provide planar dimensions similar to a current credit card of approximately 85 millimeters by 54 millimeters. The planar dimensions in the open configuration can preferably allow the present invention to fit into a wallet with other credit cards or similar cards.

The present embodiment can preferably include a first end panel 702, a second end panel 704, and a fold mechanism 706. The first end panel 702, such as a panel, leaf, or board, can be formed from a non-conductive material having a rigid, a semi-pliable, a flexible, or a combination of characteristics thereof. The first end panel 702 can include a predetermined thickness based on user requirements such as physical constraints, product features, or production needs.

Similarly, the present invention can include the second end panel 704. The second end panel 704 can include a predetermined thickness identical or different from the predetermined thickness of the first end panel 702. The predetermined thickness of the second end panel 704 is chosen to meet specific requirements of the user such as physical constraints, product features, or production needs.

The fold mechanism 706 such as a hinge, flexible section, or preformed region, can be formed as a discrete part, integral to any panel, or combination thereof. The fold mechanism 706 can be directly attached to an edge of a panel and an edge of an adjacent panel to provide rotation of the panel and the adjacent panel about the fold mechanism 706.

A spacer panel 708 can have any shape or size including substantially the same planar shape as the second end panel 704 or the first end panel 702. The fold mechanism 706 can be attached to the spacer panel 708 and the first end panel 702.

Another of the fold mechanism 706 can be attached to a side of the spacer panel 708 opposite the first end panel 702 and the second end panel 704.

An outer first end panel side 712 of the first end panel 702 can preferably include first end panel contacts 714, such as lead fingers, pads, balls, or bumps, substantially exposed on and coplanar with the outer first end panel side 712. The first end panel contacts 714 can substantially span from one edge of the outer first end panel side 712 to an opposite edge of the outer first end panel side 712.

The first end panel contacts 714 can be formed closest to a short first end edge 716 of the first end panel 702. The first end panel contacts 714 can provide electrical connectivity to memory circuitry and an external connector, subsystem, or system.

Similarly, the second end panel 704 can preferably include an outer second end panel side 718, the outer second end panel side 718 is shown behind the second end panel 704. The outer second end panel side 718 can preferably include second end panel contacts 720, such as lead fingers, pads, balls, or bumps, shown as hidden lines on the outer second end panel side 718. The second end panel contacts 720 can be exposed on and coplanar with the outer second end panel side 718 of the second end panel 704.

The second end panel contacts 720 can substantially span from one edge of the outer second end panel side 718 to an opposite edge of the outer second end panel side 718. The second end panel contacts 720 can be formed closest to a short second end edge 722 of the second end panel 704. The second end panel contacts 720 can provide electrical connectivity to memory circuitry and an external connector, subsystem, or system.

The short first end edge 716 with the first end panel contacts 714 can be adjacent a long first end edge 724 that can attach to or include a portion of the fold mechanism 706. Similarly, the short second end edge 722 with the second end panel contacts 720 can be adjacent a long second end edge 726 that can attach to or include a portion of another of the fold mechanism 706.

Long spacer edges 728 can be formed on opposite sides of the spacer panel 708. The long spacer edges 728 can attach to or include portions of the fold mechanism 706 for attachment to the first end panel 702 or the second end panel 704.

Figure 8:
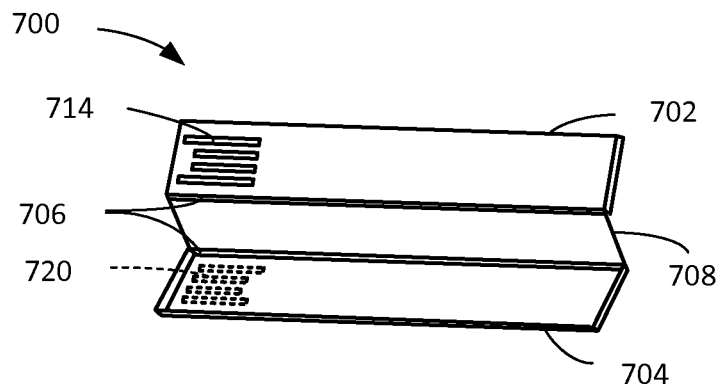
FIG. 8 is the structure of FIG. 7 in a partially folded configuration.

Referring now to FIG. 8, therein is shown the structure of FIG. 7 in a partially folded configuration. The partially folded configuration provides the present invention in a transitional phase, such as during repositioning of the first end panel 702, the spacer panel 708, and the second end panel 704 from the opened configuration to a closed configuration or vice-versa.

The present invention in the partially folded configuration includes characteristics of the first end panel 702, the spacer panel 708, or the second end panel 704 forming an obtuse, right, or acute angle with one another.

The first end panel 702, the spacer panel 708, and the second end panel 704 can preferably fold along each of a plurality of the fold mechanism 706 connecting the first end panel 702, the spacer panel 708, or the second end panel 704. Folding such as alternate folding or fan folding can provide the first end panel contacts 714 or the second end panel contacts 720 substantially exposed.

Figure 9:
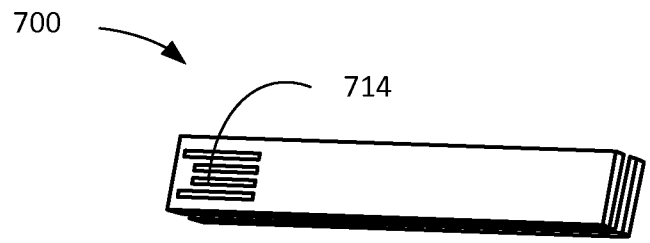
FIG. 9 is the structure of FIG. 7 in a folded configuration.

Referring now to FIG. 9, therein is shown the structure of FIG. 7 in a folded configuration. The folded configuration provides the panels substantially parallel and substantially eliminates spacing between panels to form a connector-housing.

The first end panel contacts 714 and the second end panel contacts 720 of FIG. 8 can be substantially exposed to provide connectivity to mating connectors of an electronic subsystem or system such as a computer, security system, data storage facility, or any electronic system having a connector.

Figure 10:
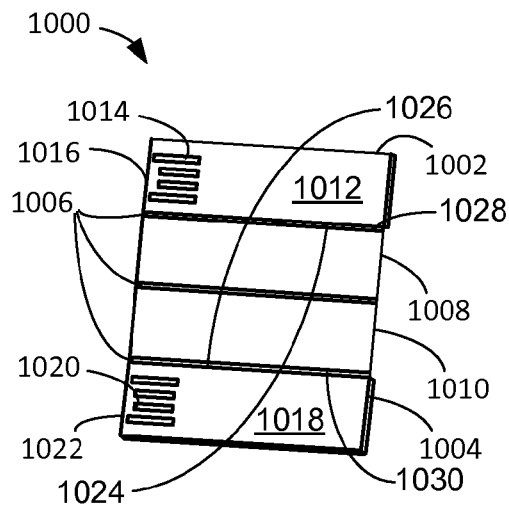
FIG. 10 is an orthogonal view of a foldable electrical connector-housing system in an open configuration of a fourth embodiment of the present invention.

Referring now to FIG. 10, therein is shown an orthogonal view of a foldable electrical connector-housing system 1000 in an open configuration of a fourth embodiment of the present invention. The open configuration can be used for transporting or storing of the foldable electrical connector-housing system 1000.

The present embodiment can preferably include a first end panel 1002, a second end panel 1004, and a fold mechanism 1006. The first end panel 1002, such as a panel, leaf, or board, can be formed from a non-conductive material having a rigid, a semi-pliable, a flexible, or a combination of characteristics thereof. The first end panel 1002 can include a predetermined thickness based on user requirements such as physical constraints, product features, or production needs.

Similarly, the present invention can include the second end panel 1004. The second end panel 1004 can include a predetermined thickness identical or different from the predetermined thickness of the first end panel 1002. The predetermined thickness of the second end panel 1004 is chosen to meet specific requirements of the user such as physical constraints, product features, or production needs.

The fold mechanism 1006 such as a hinge, flexible section, or preformed region, can be formed as a discrete part, integral to any panel, or combination thereof. The fold mechanism 1006 can be directly attached to an edge of a panel and an edge of an adjacent panel to provide rotation of the panel and the adjacent panel about the fold mechanism 1006.

A first end spacer panel 1008 or a second end spacer panel 1010 can have any shape or size including substantially the same planar shape as the second end panel 1004 or the first end panel 1002. The fold mechanism 1006 can be attached to the first end spacer panel 1008 and the first end panel 1002. Another of the fold mechanism 1006 can be attached to the first end spacer panel 1008 and the second end spacer panel 1010. Yet another of the fold mechanism 1006 can be attached to a side of the second end spacer panel 1010 and the second end panel 1004.

An outer first end panel side 1012 of the first end panel 1002 can preferably include first end panel contacts 1014, such as lead fingers, pads, balls, or bumps, substantially exposed on and coplanar with the outer first end panel side 1012. The first end panel contacts 1014 can substantially span from one edge of the outer first end panel side 1012 to an opposite edge of the outer first end panel side 1012.

The first end panel contacts 1014 can be formed closest to a short first end edge 1016 of the first end panel 1002. The first end panel contacts 1014 can provide electrical connectivity to memory circuitry and an external connector, subsystem, or system.

Similarly, the second end panel 1004 can preferably include second end panel contacts 1020 on an outer second end panel side 1018 of the second end panel 1004. The second end panel contacts 1020 can be exposed on and coplanar with a side of the second end panel 1004. The second end panel contacts 1020, such as lead fingers, pads, balls, or bumps, can substantially span from one edge of the outer second end panel side 1018 to an opposite edge of the outer second end panel side 1018.

The second end panel contacts 1020 can be formed closest to a short second end edge 1022 of the second end panel 1004. The second end panel contacts 1020 can provide electrical connectivity to memory circuitry and an external connector, subsystem, or system.

The short first end edge 1016 with the first end panel contacts 1014 can be adjacent a long first end edge 1024 that can attach to or include a portion of the fold mechanism 1006. Similarly, the short second end edge 1022 with the second end panel contacts 1020 can be adjacent a long second end edge 1026 that can attach to or include a portion of another of the fold mechanism 1006.

First end long spacer edges 1028 can be formed on opposite sides of the first end spacer panel 1008. The first end long spacer edges 1028 can attach to or include portions of the fold mechanism 1006 for attachment to the first end panel 1002 or the second end spacer panel 1010. Similarly, second end long spacer edges 1030 can be formed on opposite sides of the second end spacer panel 1010 and can attach to or include portions of the fold mechanism 1006 for attachment to the second end panel 1004 or the first end spacer panel 1008.

For purposes of illustration, the foldable electrical connector-housing system 1000 is shown having four panels although it is understood that any number of panels may be used.

Figure 11:
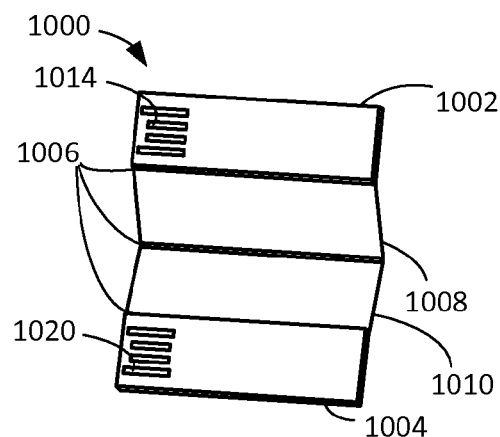
FIG. 11 is structure of FIG. 10 in a partially folded configuration.

Referring now to FIG. 11, therein is shown structure of FIG. 10 in a partially folded configuration. The partially folded configuration can be identified when an obtuse, a right, or an acute angle can be formed between the first end panel 1002 and the first end spacer panel 1008, the second end spacer panel 1010, or the second end panel 1004.

The present invention in the partially folded configuration includes characteristics of the first end panel 1002, the first end spacer panel 1008, the second end spacer panel 1010, or the second end panel 1004 forming an obtuse, right, or acute angle with one another.

The first end panel 1002, the first end spacer panel 1008, the second end spacer panel 1010, and the second end panel 1004 can preferably fold along each of a plurality of the fold mechanism 1006 connecting the first end panel 1002, the first end spacer panel 1008, the second end spacer panel 1010, or the second end panel 1004. Folding such as alternate folding or fan folding can provide the first end panel contacts 1014 or the second end panel contacts 1020 substantially exposed.

Figure 12:
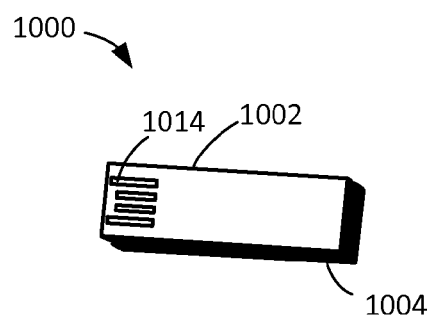
FIG. 12 is the structure of FIG. 10 in a folded configuration.

Referring now to FIG. 12, therein is shown the structure of FIG. 10 in a folded configuration. The folded configuration provides the panels substantially parallel and substantially eliminates spacing between panels to form a connector-housing.

The first end panel contacts 1014 and the second end panel contacts 1020 of FIG. 11 can be substantially exposed to provide connectivity to mating connectors of an electronic subsystem or system such as a computer, security system, data storage facility, or any electronic system having a connector.

It has been found that sides of the first end panel 1002, the first end spacer panel 1008, the second end spacer panel 1010, the second end panel 1004, or combination thereof can be printed with logos or advertising material for advertising purposes.

Figure 13:
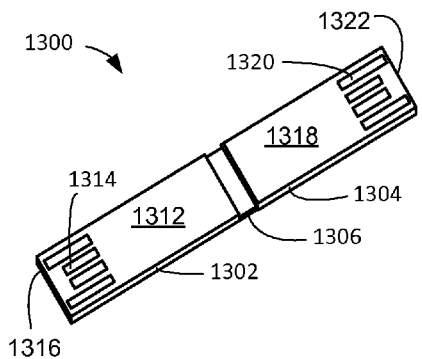
FIG. 13 is an orthogonal view of a foldable electrical connector-housing system in an open configuration of a fifth embodiment of the present invention.

Referring now to FIG. 13, therein is shown an orthogonal view of a foldable electrical connector-housing system 1300 in an open configuration of a fifth embodiment of the present invention. The open configuration can be used for transporting or storing of the foldable electrical connector-housing system 1300.

The present embodiment can preferably include a first end panel 1302, a second end panel 1304, and a fold mechanism 1306. The first end panel 1302, such as a panel, leaf, or board, can be formed from a non-conductive material having a rigid, a semi-pliable, a flexible, or a combination of characteristics thereof. The first end panel 1302 can include a predetermined thickness based on user requirements such as physical constraints, product features, or production needs.

Similarly, the present invention can include the second end panel 1304. The second end panel 1304 can include a predetermined thickness identical or different from the predetermined thickness of the first end panel 1302. The predetermined thickness of the second end panel 1304 is chosen to meet specific requirements of the user such as physical constraints, product features, or production needs.

The fold mechanism 1306 such as a hinge, flexible section, or preformed region, can be formed as a discrete part, integral to the first end panel 1302, integral to the second end panel 1304, or combination thereof. The fold mechanism 1306 can be directly attached to an edge of the first end panel 1302 and an edge of the second end panel 1304 to provide rotation of both the first end panel 1302 and the second end panel about the fold mechanism 1306.

The first end panel 1302 and the second end panel 1304 can be folded or rotated at the fold mechanism 1306 around a central axis line or fold axis line formed along a length of the fold mechanism 1306 and can optionally include at least one pin (not shown) such as flexible pin or rigid pin. The pin can preferably be small enough to ensure that any intended rotational movement is substantially unobstructed.

An outer first end panel side 1312 of the first end panel 1302 can preferably include first end panel contacts 1314, such as lead fingers, pads, balls, or bumps, substantially exposed on and coplanar with the outer first end panel side 1312. The first end panel contacts 1314 can substantially span from one edge of the outer first end panel side 1312 to an opposite edge of the outer first end panel side 1312.

The first end panel contacts 1314 can be formed closest to a short first end edge 1316 of the first end panel 1302. The first end panel contacts 1314 can provide electrical connectivity to memory circuitry and an external connector, subsystem, or system.

Similarly, an outer second end panel side 1318 of the second end panel 1304 can preferably include second end panel contacts 1320, such as lead fingers, pads, balls, or bumps, substantially exposed on and coplanar with the outer first end panel side 1312. The second end panel contacts 1320 (optional) can substantially span from one edge of the outer second end panel side 1318 to an opposite edge of the outer second end panel side 1318.

Having the first end panel contacts 1314 and the second end panel contacts 1320 on both sides (when folded) of the foldable electrical connector-housing system 1300 may allow user to insert the present invention in the female USB connector on either side, which improves usability (of course, grounding should be provided as well).

It is possible to have two flash drives embodied in a single package. Insertion with the outer first end panel side 1312 of the first end panel 1302 facing up may make electrical contact with drive A of side A. Insertion with the outer second end panel side 1318 of the second end panel 1304 facing up may make electrical contact with drive B of side B.

The second end panel contacts 1320 can be formed closest to a short second end edge 1322 of the second end panel 1304. The second end panel contacts 1320 can provide electrical connectivity to memory circuitry and an external connector, subsystem, or system.

The short first end edge 1316 opposite the first end panel contacts 1314 can attach to or include a portion of the fold mechanism 1306. Similarly, the short second end edge 1322 opposite the second end panel contacts 1320 can attach to or include a portion of the fold mechanism 1306.

Figure 14:
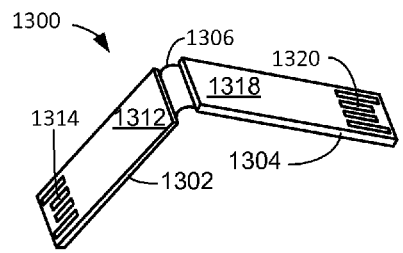
FIG. 14 is the structure of FIG. 13 in a partially folded configuration.

Referring now to FIG. 14, therein is shown the structure of FIG. 13 in a partially folded configuration. The partially folded configuration provides the present invention in a transitional phase, such as during repositioning of the first end panel 1302 and the second end panel 1304 from the opened configuration to a closed configuration or vice-versa.

The present invention in the partially folded configuration includes characteristics of the first end panel 1302 forming an obtuse, right, or acute angle with the second end panel 1304 and with the outer first end panel side 1312 of the first end panel 1302 facing away from the outer second end panel side 1318 of the second end panel 1304.

The first end panel 1302 and the second end panel 1304 can preferably fold along the fold mechanism 1306 connecting both the first end panel 1302 and the second end panel 1304. Folding such as half folding can provide the first end panel contacts 1314 or the second end panel contacts 1320 substantially exposed.

Figure 15:
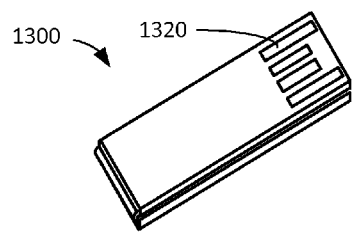
FIG. 15 is the structure of FIG. 13 in a folded configuration.

Referring now to FIG. 15, therein is shown the structure of FIG. 13 in a folded configuration. The folded configuration provides the panels substantially parallel and substantially eliminates spacing between panels to form a connector-housing.

The first end panel contacts 1314 of FIG. 14 and the second end panel contacts 1320 can be substantially exposed to provide connectivity to mating connectors of an electronic subsystem or system such as a computer, security system, data storage facility, or any electronic system having a connector.

Figure 16:
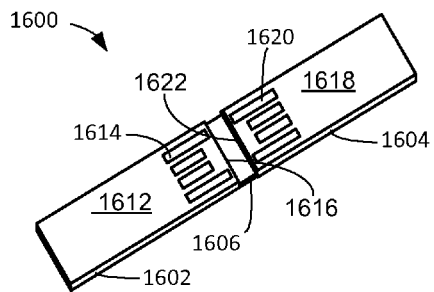
FIG. 16 is an orthogonal view of a foldable electrical connector-housing system in an open configuration of a sixth embodiment of the present invention.

Referring now to FIG. 16, therein is shown an orthogonal view of a foldable electrical connector-housing system 1600 in an open configuration of a sixth embodiment of the present invention. The open configuration can be used for transporting or storing of the foldable electrical connector-housing system 1600.

The present embodiment can preferably include a first end panel 1602, a second end panel 1604, and a fold mechanism 1606. The first end panel 1602, such as a panel, leaf, or board, can be formed from a non-conductive material having a rigid, a semi-pliable, a flexible, or a combination of characteristics thereof. The first end panel 1602 can include a predetermined thickness based on user requirements such as physical constraints, product features, or production needs.

Similarly, the present invention can include the second end panel 1604. The second end panel 1604 can include a predetermined thickness identical or different from the predetermined thickness of the first end panel 1602. The predetermined thickness of the second end panel 1604 is chosen to meet specific requirements of the user such as physical constraints, product features, or production needs.

The fold mechanism 1606 such as a hinge, flexible section, or preformed region, can be formed as a discrete part, integral to the first end panel 1602, integral to the second end panel 1604, or combination thereof. The fold mechanism 1606 can be directly attached to an edge of the first end panel 1602 and an edge of the second end panel 1604 to provide rotation of both the first end panel 1602 and the second end panel about the fold mechanism 1606.

The first end panel 1602 and the second end panel 1604 can be folded or rotated at the fold mechanism 1606 around a central axis line or fold axis line formed along a length of the fold mechanism 1606 and can optionally include at least one pin (not shown) such as flexible pin or rigid pin. The pin can preferably be small enough to ensure that any intended rotational movement is substantially unobstructed.

An outer first end panel side 1612 of the first end panel 1602 can preferably include first end panel contacts 1614, such as lead fingers, pads, balls, or bumps, substantially exposed on and coplanar with the outer first end panel side 1612. The first end panel contacts 1614 can substantially span from one edge of the outer first end panel side 1612 to an opposite edge of the outer first end panel side 1612.

The first end panel contacts 1614 can be formed closest to a short first end edge 1616 of the first end panel 1602. The first end panel contacts 1614 can provide electrical connectivity to memory circuitry and an external connector, subsystem, or system.

Similarly, an outer second end panel side 1618 of the second end panel 1604 can preferably include second end panel contacts 1620 (optional), such as lead fingers, pads, balls, or bumps, substantially exposed on and coplanar with the outer first end panel side 1612. The second end panel contacts 1620 can substantially span from one edge of the outer second end panel side 1618 to an opposite edge of the outer second end panel side 1618. As above, having connectors on both sides (when folded) may allow insertion of the folded male connector right side up or upside down, which improves usability.

The second end panel contacts 1620 can be formed closest to a short second end edge 1622 of the second end panel 1604. The first end panel contacts 1614 can provide electrical connectivity to memory circuitry and an external connector, subsystem, or system.

The short first end edge 1616 next to the first end panel contacts 1614 can attach to or include a portion of the fold mechanism 1606. Similarly, the short second end edge 1622 next to the second end panel contacts 1620 can attach to or include a portion of the fold mechanism 1606.

Figure 17:
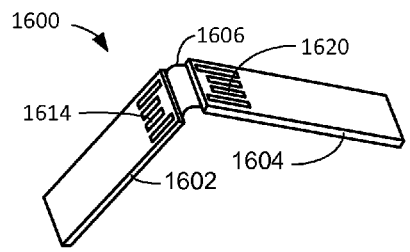
FIG. 17 is the structure of FIG. 16 in a partially folded configuration.

Referring now to FIG. 17, therein is shown the structure of FIG. 16 in a partially folded configuration. The partially folded configuration provides the present invention in a transitional phase, such as during repositioning of the first end panel 1602 and the second end panel 1604 from the opened configuration to a closed configuration or vice-versa.

The present invention in the partially folded configuration includes characteristics of the first end panel 1602 forming an obtuse, right, or acute angle with the second end panel 1604 and with the outer first end panel side 1612 of the first end panel 1602 facing away from the outer second end panel side 1618 of the second end panel 1604.

The first end panel 1602 and the second end panel 1604 can preferably fold along the fold mechanism 1606 connecting both the first end panel 1602 and the second end panel 1604. Folding such as half folding can provide the first end panel contacts 1614 or the second end panel contacts 1620 substantially exposed.

Figure 18:
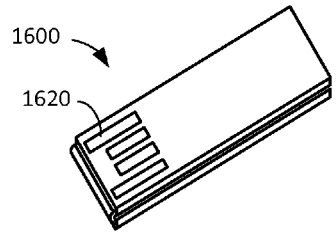
FIG. 18 is the structure of FIG. 16 in a folded configuration.

Referring now to FIG. 18, therein is shown the structure of FIG. 16 in a folded configuration. The folded configuration provides the panels substantially parallel and substantially eliminates spacing between panels to form a connector-housing.

The first end panel contacts 1614 of FIG. 17 and the second end panel contacts 1620 can be substantially exposed to provide connectivity to mating connectors of an electronic subsystem or system such as a computer, security system, data storage facility, or any electronic system having a connector.

Figure 19:
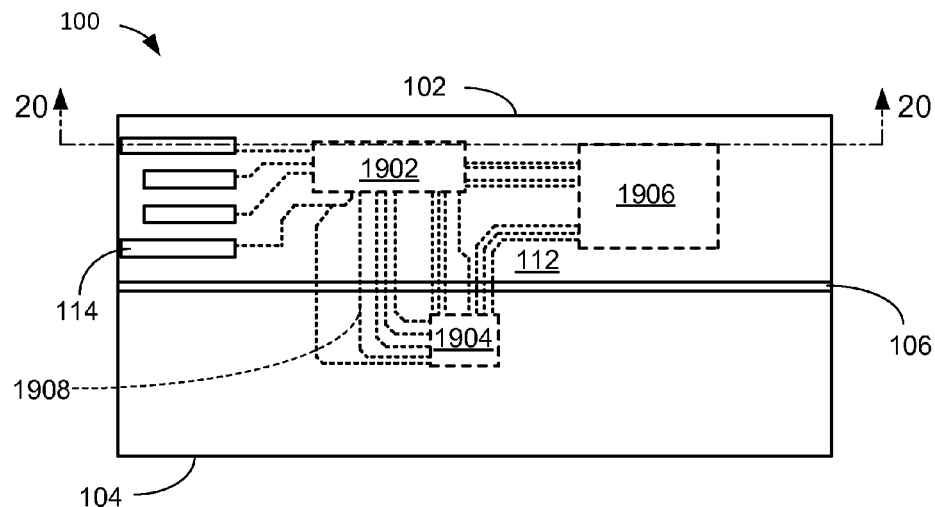
FIG. 19 is a top plan view of the foldable electrical connector-housing system in an open configuration.

Referring now to FIG. 19, therein is shown a top plan view of the foldable electrical connector-housing system 100 in an open configuration. For example, the foldable electrical connector-housing system 100 can preferably include electronic components or memory circuitry, shown with hidden lines, such as a controller 1902, a memory timing control module 1904, and a memory device 1906.

The memory device 1906 such as a flash-memory, micro-disk, or other non-volatile storage device can be electrically connected to the controller 1902, the memory timing control module 1904, or the first end panel contacts 114. The memory device 1906 can provide storage for user defined information.

Two or more sets of the memory circuitry can be used For example, the foldable electrical connector-housing system may contain two flash drives that might be organized so that one may be able to store business related files and by flipping, another drive becomes available for storing personal information. One side can optionally be labeled such as "business" and another side can optionally be labeled as "personal".

The controller 1902, such as a memory controller or universal serial bus controller, can control information such as dataflow, data format, operation of the memory device 1906, error handling/recovery, or power sequencing of the circuitry within the foldable electrical connector-housing system 100.

The memory timing control module 1904 can generate, control, or monitor the timing signals, such as clocks and clocking controls, required to maintain proper synchronization and reliable operation of the memory circuitry. In some embodiments, the memory timing control module 1904 is incorporated in the controller 1902.

Conductors 1908, shown with hidden lines, such as flexible wires, traces, strips, or any conductor can directly connect the controller 1902, the memory timing control module 1904, the memory device 1906, or the first end panel contacts 114 with one another.

For purposes of illustration, the memory device 1906 and the controller 1902 are shown in the first end panel 102, although the memory device 1906 and the controller 1902 may be in any panel or in any location or on the same panel.

Further for purposes of illustration, the memory timing control module 1904 is shown in the second end panel 104, although the memory timing control module 1904 may be in any panel or in any location or on the same panel.

Also for purposes of illustration, the conductors 1908 are shown on or in the first end panel 102 or the second end panel 104, although all or a portion of the conductors 1908 may be formed over the first end panel 102 or the second end panel 104 as an integral part of a printed circuit board or substrate.

Electrical components 1910, such as the controller 1902, the memory timing control module 1904, the memory device 1906, passive components, a power component such as a battery or a solar cell, or any other component can be included on or within the foldable electrical connector-housing system 100.

Functionally different or incompatible devices can be mounted in opposite sides or panels to provide a high reliability and availability version (HRAV) or a dual functionality version (DFV).

Some or all of the electrical components 1910, for example the controller 1902, the memory timing control module 1904, the memory device 1906, or the conductors 1908 can optionally be covered or conformally encapsulated with a non-conductive protective layer, such as a film, an epoxy, an insulator, or other non-conductive material to protect the electronics and the flexible conductors from damage.

Figure 20:
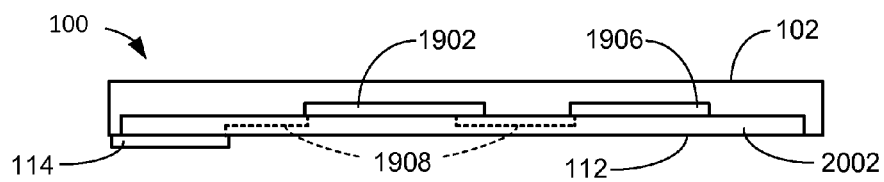
FIG. 20 is a cross-sectional view of FIG. 19 taken along a line 20-20 of FIG. 19.

Referring now to FIG. 20, therein is shown a cross-sectional view of FIG. 19 taken along a line 20-20 of FIG. 19. The foldable electrical connector-housing system 100 can, for example, include the first end panel 102 with the controller 1902, the memory timing control module 1904 of FIG. 19, the memory device 1906, a substrate 2002, and the first end panel contacts 114.

The substrate 2002 such as a thin film, a thick film, a printed circuit board, or a flex type board, can provide mounting and connectivity for the memory circuitry and the first end panel contacts 114. Optionally, the controller 1902, the memory timing control module 1904, the memory device 1906, or the first end panel contacts 114 can also be mounted directly to panels and electrically connected with the flexible conductors.

For example, flexible circuit boards are a means of creating a thin medium for mounting the controller 1902, the memory timing control module 1904, the memory device 1906 and the flexible conductors can be used to connect the controller 1902, the memory timing control module 1904, the memory device 1906, or the substrate 2002 on two or more panels.

For purposes of illustration, the first end panel contacts 114 are shown protruding beyond the outer first end panel side 112 of the first end panel 102 although it is understood that the first end panel contacts 114 can be formed in any location, orientation, or relative position to the outer first end panel side 112.

Figure 21:
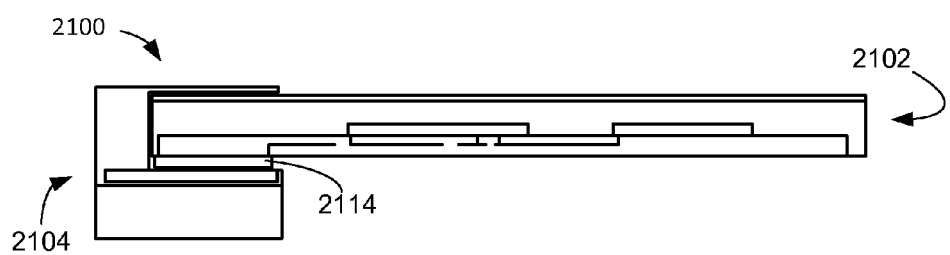
FIG. 21 is a cross-sectional view of the structure of FIG. 20 in a connection phase.

Referring now to FIG. 21, therein is shown a cross-sectional view of the structure of FIG. 20 in a connection phase. A foldable electrical connector-housing 2102, substantially the same as the foldable electrical connector-housing system 100 can be connected to a connector 2104 such as a female universal serial bus connector (USB connector), a user specific female connector, an enclosure, an assembly, or various electronic systems.

First end panel contacts 2114, substantially the same as the first end panel contacts 114 of FIG. 1 can be fully inserted into the connector 2104.

The connector 2104 can preferably fully enclose a portion of the foldable electrical connector-housing 2102 and substantially enclose the first end panel contacts 2114.

The connector 2104 can receive folded panels with the first end panel contacts 2114 to provide pressure for an interference fit within the connector 2104. The first end panel contacts 2114 inserted in the connector 2104 can provide electrical connectivity to a subsystem or system.

Figure 22:
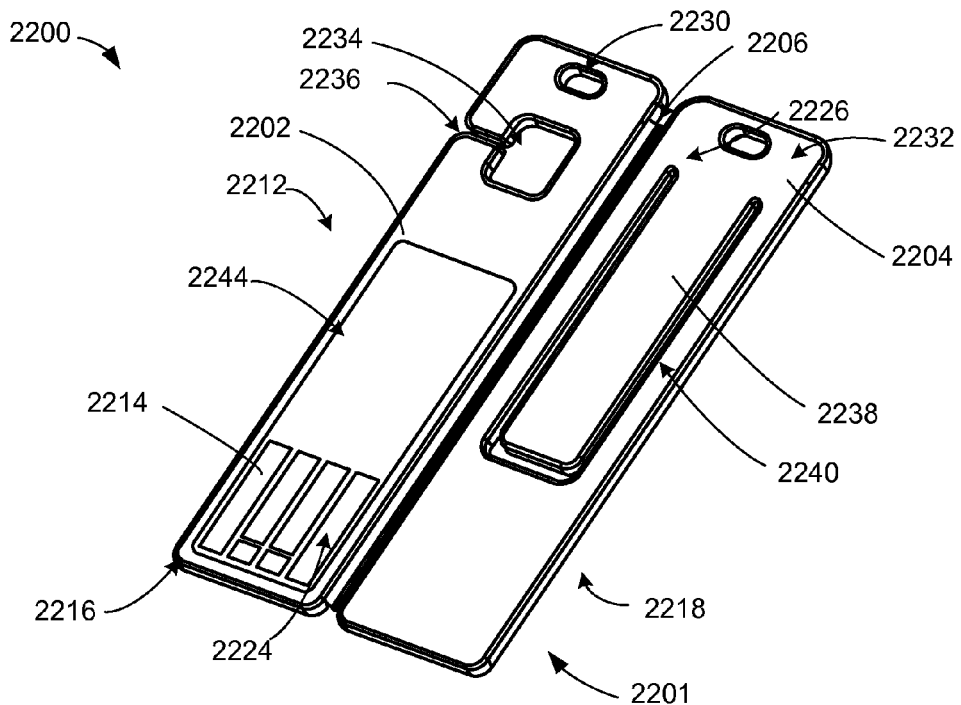
FIG. 22 is a perspective view of a foldable electrical connector-housing system in an unfolded configuration of a seventh embodiment of the present invention.

Referring now to FIG. 22, therein is shown a perspective view of a foldable electrical connector-housing system 2200 in an unfolded configuration 2201 of a seventh embodiment of the present invention. The unfolded configuration can be used for attaching or storing of the foldable electrical connector-housing system 2200.

The foldable electrical connector-housing system 2200 can be a variety of systems with a pluggable interface. In an illustrative example, the foldable electrical connector-housing system 2200 can be a memory device. For example, the foldable electrical connector-housing system 2200 can be a Universal Serial Bus (USB) memory stick having flash memory. In another illustrative example, the foldable electrical connector-housing system 2200 can provide other interfaces having external connectors.

The foldable electrical connector-housing system 2200 can include a first end panel 2202, a second end panel 2204, and a fold mechanism 2206. The first end panel 2202, such as a panel, leaf, or board, can be formed from a non-conductive material having a rigid, a semi-pliable, a flexible, or a combination of characteristics thereof. The first end panel 2202 can include a predetermined thickness based on user requirements such as physical constraints, product features, or production needs.

The second end panel 2204 can be similar to the first end panel 2202. The second end panel 2204 can include a predetermined thickness identical or different from the predetermined thickness of the first end panel 2202. The predetermined thickness of the second end panel 2204 is chosen to meet specific requirements of the user such as physical constraints, product features, or production needs.

For purposes of illustration, the first end panel 2202 and the second end panel 2204 are shown in a shape of a rectangle although the first end panel 2202 or the second end panel 2204 may be of any shape, size or different from one another.

The first end panel contacts 2214 of the first end panel 2202 can substantially span from one edge of an outer first end panel side 2212 to an opposite edge of the outer first end panel side 2212. The first end panel contacts 2214 can provide electrical connectivity to an electronic component, such as memory circuitry, and an external connector, subsystem, or system. In an illustrative example, the first end panel contacts 2214 can be for a Universal Serial Bus (USB) connection.

The outer first end panel side 2212 of the first end panel 2202 can preferably include the first end panel contacts 2214, such as lead fingers, pads, balls, or bumps, substantially exposed on and coplanar with the outer first end panel side 2212. The first end panel contacts 2214 can preferably be formed closest to a short first end edge 2216 of the first end panel 2202.

For purposes of illustration, the first end panel contacts 2214 are shown next to one edge of the outer first end panel side 2212, although the first end panel contacts 2214 can be of any number, in any location, on any side, in any number of locations, next to any edge, or have a spacing from any edge.

The fold mechanism 2206 such as a hinge, live-hinge, flexible section, indented section, or preformed region, can be formed in a variety of ways. For example, the fold mechanism 2206 can be formed as a discrete part, integral to the first end panel 2202, integral to the second end panel 2204, or combination thereof.

The fold mechanism 2206 can have a variety of configurations. The fold mechanism 2206 can be directly attached to an edge of the first end panel 2202 and an edge of the second end panel 2204 to provide rotation of both the first end panel 2202 and the second end panel 2204 about the fold mechanism 2206. In an illustrative example, the fold mechanism 2206 can have a flat surface on the back side and have an indentation on the front side. The indentation on the front side makes it easier to fold and bend at the indentation.

The rotation of both the first end panel 2202 and the second end panel 2204 can provide the outer first end panel side 2212 facing away from an outer second end panel side 2218. For example, when folded, the outer first end panel side 2212 and the outer second end panel side 2218 can be substantially exposed and opposite one another.

Furthermore, for example, the fold mechanism 2206 can be provided on a long first end edge 2224 of the first end panel 2202 and a long second end edge 2226 of the second end panel 2204. The fold mechanism 2206 can rotate 180 degrees.

The first end panel 2202 and the second end panel 2204 can be folded or rotated at the fold mechanism 2206 around a central axis line or fold axis line formed along a length of the fold mechanism 2206 and can optionally include at least one pin (not shown) such as flexible pin or rigid pin. The pin can preferably be small enough to ensure that any intended rotational movement is substantially unobstructed.

In the unfolded configuration, a plane of the outer first end panel side 2212 can be substantially coplanar to a plane of the outer second end panel side 2218. Thus, the outer first end panel side 2212 and the outer second end panel side 2218 can form a substantially flat surface. The substantially flat surface can optionally be printed, labeled, or stamped with images or text.

The first end panel 2202 can include a first lanyard opening 2230 at the end of the first end panel 2202 opposite from the first end panel contacts 2214. The first lanyard opening 2230 is for attaching a lanyard (not shown) through the first lanyard opening 2230. The first lanyard opening 2230 can include a notch on the outer side of the first end panel 2202. The second end panel 2204 can include a second lanyard opening 2232 at the end of the second end panel 2204. The second lanyard opening 2232 can include a notch on the outer side of the second end panel 2204. The first lanyard opening 2230 and the second lanyard opening 2232 are for attaching a lanyard (not shown) to the foldable electrical connector-housing system 2200.

The first end panel 2202 and the second end panel 2204 can be folded or rotated around the fold mechanism 2206 to position the first lanyard opening 2230 and the second lanyard opening 2232 in an aligned configuration with the notch sides of each of the openings facing outward. The first lanyard opening 2230 and the second lanyard opening 2232 are positioned at an equal distance from the fold mechanism 2206 to form a lanyard opening extending completely through the folded unit.

The first end panel 2202 can include a binder opening 2234 extending completely through the first end panel 2202. The binder opening 2234 can include beveled edges on both sides of the first end panel 2202. The beveled edges can be segmented, rounded, or a combination thereof.

The binder opening 2234 can have a variety of shapes. For example, the binder opening 2234 can be round, square, oval, rectangular, or any other geometric shape. In an illustrative example, the binder opening 2234 can be a rounded square having rounded corners to accommodate the shapes of posts or binder rings.

The first end panel 2202 can include a binder notch 2236 extending from the binder opening 2234 to the outer first end panel side 2212. The binder notch 2236 is a gap in the material of the first end panel 2202. The binder notch 2236 can have beveled edges. The beveled edges can be segmented, rounded, or a combination thereof. The beveled edges can make it easier to attach the foldable electrical connector-housing system 2200 to a post or binder ring using the split-hole formed by the combination of the binder opening 2234 and the binder notch 2236. The beveled edges can also provide a visual orientation indicator when folding the system.

It has been discovered that the binder notch 2236 in the first end panel 2202 can simplify attaching the binder opening 2234 to a post or binder ring. The binder notch 2236 provides increased flexibility in the first end panel 2202 to allow the binder opening 2234 and the binder notch 2236 to flex open and allow the post or binder ring to be inserted into the binder opening 2234 though the binder notch 2236 in a flexed configuration. The binder notch 2236 can allow the foldable electrical connector-housing system 2200 to deform without damaging the electronic unit 2244 for attaching to the binder ring without opening the binder ring. The electronic unit 2244 is spaced away from the binder opening 2234 to prevent damage.

The second end panel 2204 can include a clip mechanism 2238 formed from the material of the second end panel 2204. The clip mechanism 2238 is for attaching the system to a flat structure, such as a piece of paper, cardboard, or plastic.

Although the clip mechanism 2238 is shown as the same thickness as the second end panel 2204, it is understood that the thickness of the clip mechanism 2238 can be different from the second end panel 2204. For example, the clip mechanism 2238 can be thinner than the thickness of the second end panel 2204 to increase the flexibility and functionality of the clip mechanism 2238.

The clip mechanism 2238 can employ different mechanisms for increased flexibility of the clip mechanism 2238. In an illustrative example, the clip mechanism 2238 can include depressions (not shown) in the clip mechanism 2238 to increase the flexibility of the clip mechanism 2238 to allow it to attach to flat structures. The depressions, such as grooves, notches, holes, patterned holes, lines, troughs, or other a combination thereof, can be on either side of the clip mechanism 2238.

The clip mechanism 2238 can be formed in the second end panel 2204 by forming a clip opening 2240 around three sides of the clip mechanism 2238 and extending completely through the second end panel 2204. The clip opening 2240 can have a "U" shape around the clip mechanism 2238. The clip opening 2240 can have beveled edges. The beveled edges can be segmented, rounded, or a combination thereof.

Although the clip mechanism 2238 is shown as formed in the second end panel 2204, it is understood that the clip mechanism 2238 can have other configurations. For example, the clip mechanism can be formed in at least one of the two end panels, such as the first end panel 2202, the second end panel 2204, or both. In another example, the clip mechanism 2238 can be formed in first end panel 2202.

The clip mechanism 2238 can be formed in a variety of ways. For example, the clip mechanism 2238 can be formed integrally with one of the end panels. In another example, the clip mechanism 2238 can be formed in one of the end panels by forming the clip opening 2240 using cutting, drilling, etching, laser cutting, grinding, milling, or a combination thereof.

The foldable electrical connector-housing system 2200 can include an electronic unit 2244 such as the controller 1902 of FIG. 19, the memory timing control module 1904 of FIG. 19, the memory device 1906 of FIG. 19, or a combination thereof. For example, the electronic unit 2244, such as the memory device 1906, can be attached to the first end panel 2202. The electronic unit 2244 can be electrically coupled to the first end panel contacts 2214.

The foldable electrical connector-housing system 2200 can have a variety of configurations. For example, the electronic unit 2244 can include a flash memory chip in a Chip-on-Board (CoB) configuration. In another example, the electronic unit 2244 can include the first end panel contacts 2214. The electronic unit 2244 can include both the first end panel contacts 2214 and the flash memory chip in a single unit. In yet another example, the foldable electrical connector-housing system 2200 can include the electronic unit 2244 on the first end panel 2202 and another of the electronic unit 2244 on the second end panel 2204 with one or more memory units on each of the end panels. The electronic unit 2244 on the first end panel 2202 can be coupled to the first end panel contacts and the electronic unit 2244 on the second end panel 2204 can be coupled to the second end panel contacts.

In an illustrative example, the foldable electrical connector-housing system 2200 can have an unfolded configuration with the first end panel 2202 and the second end panel 2204 coplanar with one another. The foldable electrical connector-housing system 2200 can be stored or transferred in the unfolded configuration. For example, the foldable electrical connector-housing system 2200 can be sent in a mailing envelope.

In the unfolded configuration, the foldable electrical connector-housing system 2200 can be easily stored in a binder. For example, the foldable electrical connector-housing system 2200 can be attached with the binder ring through the binder opening 2234.

It has been discovered that the foldable electrical connector-housing system 2200 can be easily stored or transported in the unfolded configuration using the clip mechanism 2238.

The foldable electrical connector-housing system 2200 attaches to a flat structure, such as a piece of paper, cardboard, or plastic within the binder with the clip mechanism 2238. The clip mechanism 2238 holds the foldable electrical connector-housing system 2200 securely to the flat structure in a friction lock.

It has been discovered that the foldable electrical connector-housing system 2200 can be easily stored or transported in the unfolded configuration. The foldable electrical connector-housing system 2200 can be attached to a flat structure with staples or adhesive. The material of the first end panel 2202 and the second end panel 2204 can be penetrated and stapled to a flat structure. Because the back side of the foldable electrical connector-housing system 2200 has no active components, the back side can be attached to a flat structure with an adhesive.

The foldable electrical connector-housing system 2200 can have a folded configuration with the back side of the first end panel 2202 and the back side of the second end panel 2204 in contact with one another. In another example, the back side of the first end panel 2202 and the back side of the second end panel 2204 can be facing one another.

In the folded configuration, the foldable electrical connector-housing system 2200 can form a male-connector portion of a USB device. In the folded configuration, the first end panel contacts 2214 can be exposed on an outer side of the foldable electrical connector-housing system 2200.

The foldable electrical connector-housing system 2200 can be formed in a variety of ways. For example, the foldable electrical connector-housing system 2200 can be formed by 3-dimensional printing, injection molding, pressing, stamping, laser cutting, or a combination thereof.

The foldable electrical connector-housing system 2200 can be formed from a variety of materials. For example, the first end panel 2202 and the second end panel 2204 of the foldable electrical connector-housing system 2200 can be formed from plastic, polymer, resin, cardboard, metal, or a combination thereof.

In another example, the size of the foldable electrical connector-housing system 2200 can have different ratios. For example, in the unfolded configuration, the overall length versus width can be a ratio of approximately 1.41. In yet another example, the overall length versus width can be a ratio of approximately 1.618 in the unfolded configuration of the foldable electrical connector-housing system 2200.

It has been discovered that one set of the first end panel contacts 2214 can be included next to one of the short first end edge 2216 and another set of the first end panel contacts 2214 can be included next to another of the short first end edge 2216. This can increase the number of available memory devices. Different devices can be accessed by rotating the system to position either of the first end panel contacts 2214 in contact with connectors on the other side.

It has been discovered that folding the first end panel 2202 and the second end panel 2204 into the folded configuration increases functionality and connectivity. Folding the first end panel 2202 by 180 degrees around the fold mechanism 2206 and onto the second end panel 2204 allows the foldable electrical connector-housing system to be inserted into the female port (not shown) of an external system (not shown).

Figure 23:
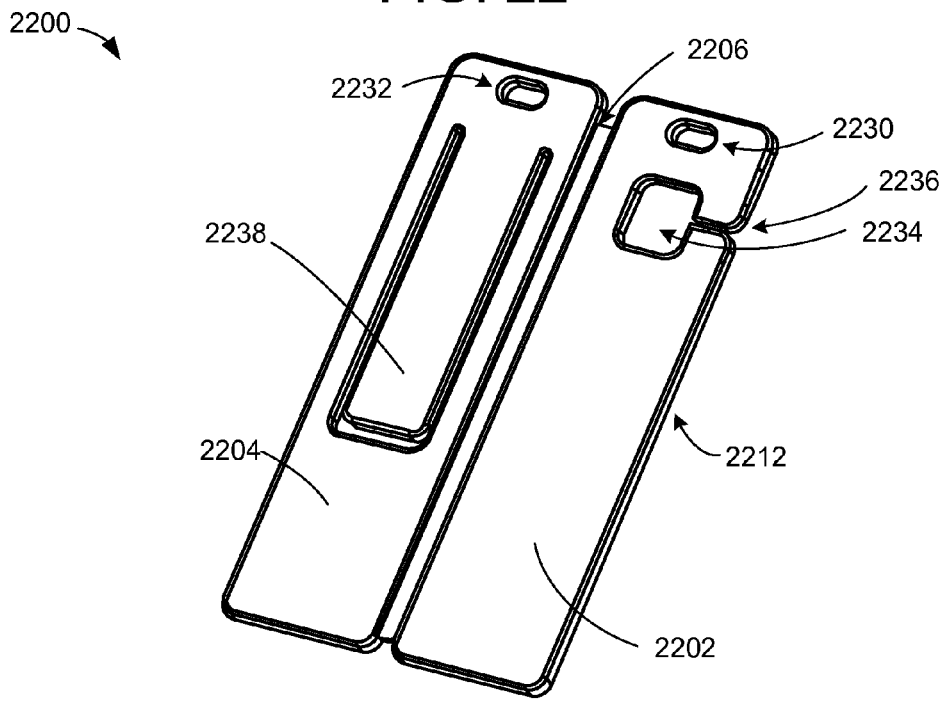
FIG. 23 is a perspective view of a back side of the foldable electrical connector-housing system in an unfolded configuration.

Referring now to FIG. 23, therein is shown a perspective view of a back side of the foldable electrical connector-housing system 2200 in an unfolded configuration. The unfolded configuration can be used for attaching or storing of the foldable electrical connector-housing system 2200.

The foldable electrical connector-housing system 2200 can include the first end panel 2202, the second end panel 2204, and the fold mechanism 2206. The first end panel 2202, such as a panel, leaf, or board, can be formed from a non-conductive material having a rigid, a semi-pliable, a flexible, or a combination of characteristics thereof. The first end panel 2202 can include a predetermined thickness based on user requirements such as physical constraints, product features, or production needs. The second end panel 2204 can be similar to the first end panel 2202.

The fold mechanism 2206 such as a hinge, live-hinge, flexible section, indented section, or preformed region, can be formed in a variety of ways. For example, the fold mechanism 2206 can be formed as a discrete part, integral to the first end panel 2202, integral to the second end panel 2204, or combination thereof. In another example, the fold mechanism 2206 can have a flat surface on the back side.

The first end panel 2202 can include the first lanyard opening 2230 at the end of the first end panel 2202. The first lanyard opening 2230 can include a notch on the back side of the first end panel 2202. The second end panel 2204 can include the second lanyard opening 2232 at the end of the second end panel 2204. The second lanyard opening 2232 can include a notch on the back side of the second end panel 2204.

The first end panel 2202 can include the binder opening 2234 extending completely through the first end panel 2202. The binder opening 2234 can include beveled edges on both sides of the first end panel 2202. The beveled edges can be segmented, rounded, or a combination thereof.

The first end panel 2202 can include the binder notch 2236 extending from the binder opening 2234 to the outer first end panel side 2212. The binder notch 2236 is a gap in the material of the first end panel 2202.

The second end panel 2204 can include the clip mechanism 2238 formed from the material of the second end panel 2204. The clip mechanism 2238 is for attaching the system to a flat structure, such as a piece of paper, cardboard, or plastic.

The foldable electrical connector-housing system 2200 can have a folded configuration with the back side of the first end panel 2202 and the back side of the second end panel 2204 in contact with one another. In another example, the back side of the first end panel 2202 and the back side of the second end panel 2204 can be facing one another.

Figure 24:
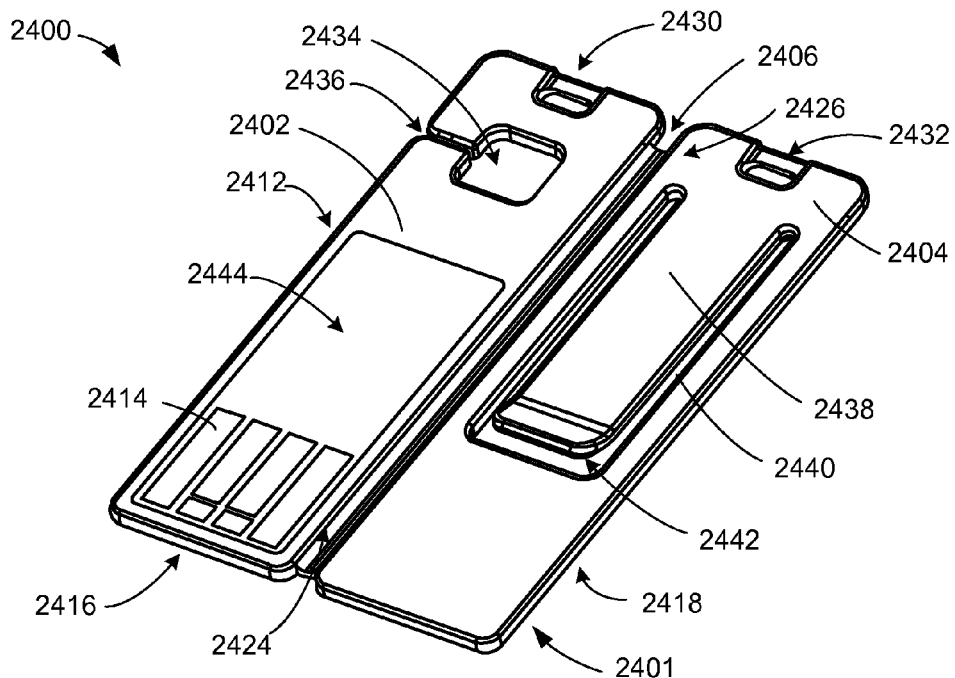
FIG. 24 is a perspective view of a foldable electrical connector-housing system in an unfolded configuration of an eighth embodiment of the present invention.

Referring now to FIG. 24, therein is shown a perspective view of a foldable electrical connector-housing system 2400 in an unfolded configuration 2401 of an eighth embodiment of the present invention. The unfolded configuration can be used for attaching or storing of the foldable electrical connector-housing system 2400.

The foldable electrical connector-housing system 2400 can be a variety of systems with a pluggable interface. In an illustrative example, the foldable electrical connector-housing system 2400 can be a memory device. For example, the foldable electrical connector-housing system 2400 can be a Universal Serial Bus (USB) memory stick having flash memory. In another illustrative example, the foldable electrical connector-housing system 2400 can provide other interfaces having external connectors.

The foldable electrical connector-housing system 2400 can include a first end panel 2402, a second end panel 2404, and a fold mechanism 2406. The first end panel 2402, such as a panel, leaf, or board, can be formed from a non-conductive material having a rigid, a semi-pliable, a flexible, or a combination of characteristics thereof. The first end panel 2402 can include a predetermined thickness based on user requirements such as physical constraints, product features, or production needs.

The second end panel 2404 can be similar to the first end panel 2402. The second end panel 2404 can include a predetermined thickness identical or different from the predetermined thickness of the first end panel 2402. The predetermined thickness of the second end panel 2404 is chosen to meet specific requirements of the user such as physical constraints, product features, or production needs.

For purposes of illustration, the first end panel 2402 and the second end panel 2404 are shown in a shape of a rectangle although the first end panel 2402 or the second end panel 2404 may be of any shape, size or different from one another.

The first end panel contacts 2414 of the first end panel 2402 can substantially span from one edge of an outer first end panel side 2412 to an opposite edge of the outer first end panel side 2412. The first end panel contacts 2414 can provide electrical connectivity to an electronic component, such as memory circuitry, and an external connector, subsystem, or system. In an illustrative example, the first end panel contacts 2414 can be for a Universal Serial Bus (USB) connection.

The outer first end panel side 2412 of the first end panel 2402 can preferably include the first end panel contacts 2414, such as lead fingers, pads, balls, or bumps, substantially exposed on and coplanar with the outer first end panel side 2412. The first end panel contacts 2414 can preferably be formed closest to a short first end edge 2416 of the first end panel 2402.

For purposes of illustration, the first end panel contacts 2414 are shown next to one edge of the outer first end panel side 2412, although the first end panel contacts 2414 can be of any number, in any location, on any side, in any number of locations, next to any edge, or have a spacing from any edge.

The fold mechanism 2406 such as a hinge, live-hinge, flexible section, indented section, or preformed region, can be formed in a variety of ways. For example, the fold mechanism 2406 can be formed as a discrete part, integral to the first end panel 2402, integral to the second end panel 2404, or combination thereof.

The fold mechanism 2406 can have a variety of configurations. The fold mechanism 2406 can be directly attached to an edge of the first end panel 2402 and an edge of the second end panel 2404 to provide rotation of both the first end panel 2402 and the second end panel 2404 about the fold mechanism 2406. In an illustrative example, the fold mechanism 2406 can have a flat surface on the back side and have an indentation on the front side. The indentation on the front side makes it easier to fold and bend at the indentation.

The rotation of both the first end panel 2402 and the second end panel 2404 can provide the outer first end panel side 2412 facing away from an outer second end panel side 2418. For example, when folded, the outer first end panel side 2412 and the outer second end panel side 2418 can be substantially exposed and opposite one another.

Furthermore, for example, the fold mechanism 2406 can be provided on a long first end edge 2424 of the first end panel 2402 and a long second end edge 2426 of the second end panel 2404. The fold mechanism 2406 can rotate 180 degrees.

The first end panel 2402 and the second end panel 2404 can be folded or rotated at the fold mechanism 2406 around a central axis line or fold axis line formed along a length of the fold mechanism 2406 and can optionally include at least one pin (not shown) such as flexible pin or rigid pin. The pin can preferably be small enough to ensure that any intended rotational movement is substantially unobstructed.

In the unfolded configuration, a plane of the outer first end panel side 2412 can be substantially coplanar to a plane of the outer second end panel side 2418. Thus, the outer first end panel side 2412 and the outer second end panel side 2418 can form a substantially flat surface. The substantially flat surface can optionally be printed, labeled, or stamped with images or text.

The first end panel 2402 can include a first lanyard opening 2430 at the end of the first end panel 2402 opposite from the first end panel contacts 2414. The first lanyard opening 2430 can include a notch on the outer side of the first end panel 2402. The second end panel 2404 can include a second lanyard opening 2432 at the end of the second end panel 2404. The second lanyard opening 2432 can include a notch on the outer side of the second end panel 2404. The first lanyard opening 2430 and the second lanyard opening 2432 are for attaching a lanyard (not shown) to the foldable electrical connector-housing system 2400.

The first end panel 2402 and the second end panel 2404 can be folded or rotated around the fold mechanism 2406 to position the first lanyard opening 2430 and the second lanyard opening 2432 in an aligned configuration with the notch sides of each of the openings facing outward. The first lanyard opening 2430 and the second lanyard opening 2432 are positioned at an equal distance from the fold mechanism 2406 to form a lanyard opening extending completely through the folded unit.

The first end panel 2402 can include a binder opening 2434 extending completely through the first end panel 2402. The binder opening 2434 can include beveled edges on both sides of the first end panel 2402. The beveled edges can be segmented, rounded, or a combination thereof.

The binder opening 2434 can have a variety of shapes. For example, the binder opening 2434 can be round, square, oval, rectangular, or any other geometric shape. In an illustrative example, the binder opening 2434 can be a rounded square having rounded corners to accommodate the shapes of posts or binder rings.

The first end panel 2402 can include a binder notch 2436 extending from the binder opening 2434 to the outer first end panel side 2412. The binder notch 2436 is a gap in the material of the first end panel 2402. The binder notch 2436 can have beveled edges. The beveled edges can be segmented, rounded, or a combination thereof. The beveled edges can make it easier to attach the foldable electrical connector-housing system 2400 to a post or binder ring using the split-hole formed by the combination of the binder opening 2434 and the binder notch 2436. The beveled edges can also provide a visual orientation indicator when folding the system.

It has been discovered that the binder notch 2436 in the first end panel 2402 can simply attaching the binder opening 2434 to a post or binder ring. The binder notch 2436 provides increased flexibility in the first end panel 2402 to allow the binder opening 2434 and the binder notch 2436 to flex open and allow the post or binder ring to be inserted into the binder opening 2434 though the binder notch 2436 in a flexed configuration. The binder notch 2436 can allow the foldable electrical connector-housing system 2400 to deform without breaking for attaching to the binder ring without opening the binder ring.

The second end panel 2404 can include a clip mechanism 2438 formed from the material of the second end panel 2404. The clip mechanism 2438 is for attaching the system to a flat structure, such as a piece of paper, cardboard, or plastic.

Although the clip mechanism 2438 is shown as the same thickness as the second end panel 2404, it is understood that the thickness of the clip mechanism 2438 can be different from the second end panel 2404. For example, the clip mechanism 2438 can be thinner than the thickness of the second end panel 2404 to increase the flexibility and functionality of the clip mechanism 2438.

The clip mechanism 2438 can employ different mechanisms for increased flexibility of the clip mechanism 2438. In an illustrative example, the clip mechanism 2438 can include depressions (not shown) in the clip mechanism 2438 to increase the flexibility of the clip mechanism 2438 to allow it to attach to flat structures. The depressions, such as grooves, notches, holes, patterned holes, lines, troughs, or other a combination thereof, can be on either side of the clip mechanism 2438.

The clip mechanism 2438 can be formed in the second end panel 2404 by forming a clip opening 2440 around three sides of the clip mechanism 2438 and extending completely through the second end panel 2404. The clip opening 2440 can have a "U" shape around the clip mechanism 2438. The clip opening 2440 can have beveled edges. The beveled edges can be segmented, rounded, or a combination thereof.

Although the clip mechanism 2438 is shown as formed in the second end panel 2404, it is understood that the clip mechanism 2438 can have other configurations. For example, the clip mechanism can be formed in at least one of the two end panels, such as the first end panel 2402, the second end panel 2404, or both. In another example, the clip mechanism 2438 can be formed in first end panel 2402.

The clip mechanism 2438 can be formed in a variety of ways. For example, the clip mechanism 2438 can be formed integrally with one of the end panels. In another example, the clip mechanism 2438 can be formed in one of the end panels by forming the clip opening 2440 using cutting, drilling, etching, laser cutting, grinding, milling, or a combination thereof.

The clip mechanism 2438 can have an angled tip 2442. The angled tip 2442 bends outward from the surface of the second end panel 2404. The angled tip 2442 can have an angle above the second end panel 2404 of between 0 and 45 degrees.

It has been discovered that forming the angled tip 2442 on the clip mechanism 2438 increases functionality and simplifies operation. The angled tip 2442 facilitates attaching the clip mechanism 2438 to a flat structure by channeling a flat material between the clip mechanism 2438 and the body of the second end panel 2404 to form a friction lock.

It has been discovered that forming the angled tip 2442 on the clip mechanism 2438 increases functionality and simplifies operation. The angled tip 2442 extends above the surface of the second end panel 2404 and prevents the improper folding of the fold mechanism 2406. The angled tip 2442 on the clip mechanism 2438 insures that the foldable electrical connector-housing system 2400 can only be folded with the back side of the first end panel 2402 in directly flush contact with the back side of the second end panel 2404.

The foldable electrical connector-housing system 2400 can include an electronic unit 2444 such as the controller 1902 of FIG. 19, the memory timing control module 1904 of FIG. 19, the memory device 1906 of FIG. 19, or a combination thereof. For example, the electronic unit 2444, such as the memory device 1906, can be attached to the first end panel 2402. The electronic unit 2444 can be electrically coupled to the first end panel contacts 2414.

The foldable electrical connector-housing system 2400 can have a variety of configurations. For example, the electronic unit 2444 can include a flash memory chip in a Chip-on-Board configuration. In another example, the electronic unit 2444 can include the first end panel contacts 2414. The electronic unit 2444 can include both the first end panel contacts 2414 and the flash memory chip in a single unit. In yet another example, the foldable electrical connector-housing system 2400 can include the electronic unit 2444 on the first end panel 2402 and another of the electronic unit 2444 on the second end panel 2404 with one or more memory units on each of the end panels. The electronic unit 2444 on the first end panel 2402 can be coupled to the first end panel contacts and the electronic unit 2444 on the second end panel 2404 can be coupled to the second end panel contacts.

In an illustrative example, the foldable electrical connector-housing system 2400 can have an unfolded configuration with the first end panel 2402 and the second end panel 2404 coplanar with one another. The foldable electrical connector-housing system 2400 can be stored or transferred in the unfolded configuration. For example, the foldable electrical connector-housing system 2400 can be sent in a mailing envelope.

In the unfolded configuration, the foldable electrical connector-housing system 2400 can be easily stored in a binder. For example, the foldable electrical connector-housing system 2400 can be attached with the binder ring through the binder opening 2434.

It has been discovered that the foldable electrical connector-housing system 2400 can be easily stored or transported in the unfolded configuration using the clip mechanism 2438. The foldable electrical connector-housing system 2400 attaches to a flat structure, such as a piece of paper, cardboard, or plastic within the binder with the clip mechanism 2438. The clip mechanism 2438 holds the foldable electrical connector-housing system 2400 securely to the flat structure in a friction lock.

It has been discovered that the foldable electrical connector-housing system 2400 can be easily stored or transported in the unfolded configuration. The foldable electrical connector-housing system 2400 can be attached to a flat structure with staples or adhesive. The material of the first end panel 2402 and the second end panel 2404 can be penetrated and stapled to a flat structure. Because the back side of the foldable electrical connector-housing system 2400 has no active components, the back side can be attached to a flat structure with an adhesive.

The foldable electrical connector-housing system 2400 can have a folded configuration with the back side of the first end panel 2402 and the back side of the second end panel 2404 in contact with one another. In another example, the back side of the first end panel 2402 and the back side of the second end panel 2404 can be facing one another.

In the folded configuration, the foldable electrical connector-housing system 2400 can form a male-connector portion of a USB device. In the folded configuration, the first end panel contacts 2414 can be exposed on an outer side of the foldable electrical connector-housing system 2400.

The foldable electrical connector-housing system 2400 can be formed in a variety of ways. For example, the foldable electrical connector-housing system 2400 can be formed by 3-dimensional printing, injection molding, pressing, stamping, laser cutting, or a combination thereof.

The foldable electrical connector-housing system 2400 can be formed from a variety of materials. For example, the first end panel 2402 and the second end panel 2404 of the foldable electrical connector-housing system 2400 can be formed from plastic, polymer, resin, cardboard, metal, or a combination thereof.

In another example, the size of the foldable electrical connector-housing system 2400 can have different ratios. For example, in the unfolded configuration, the overall length versus width can be a ratio of 1.41. In yet another example, the overall length versus width can be a ratio 1.618 in the unfolded configuration of the foldable electrical connector-housing system 2400.

It has been discovered that one set of the first end panel contacts 2414 can be included next to one of the short first end edge 2416 and another set of the first end panel contacts 2414 can be included next to another of the short first end edge 2416. This can increase the number of available memory devices. Different devices can be accessed by rotating the system to position either of the first end panel contacts 2414 in contact with connectors on the other side.

Figure 25:
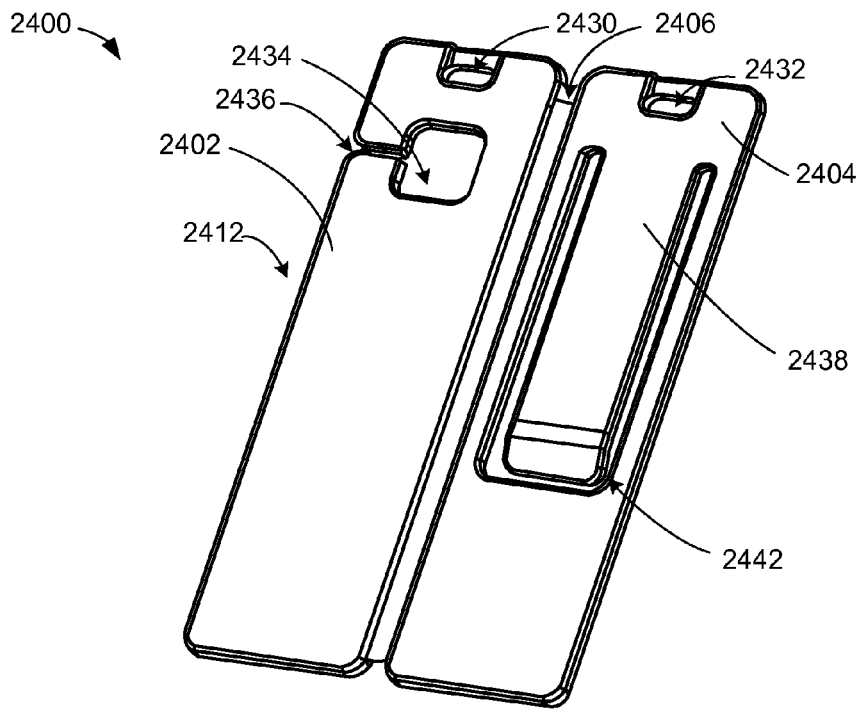
FIG. 25 is a perspective view of a back side of the foldable electrical connector-housing system in an unfolded configuration.

Referring now to FIG. 25, therein is shown a perspective view of a back side of the foldable electrical connector-housing system 2400 in an unfolded configuration. The unfolded configuration can be used for attaching or storing of the foldable electrical connector-housing system 2400.

The foldable electrical connector-housing system 2400 can include the first end panel 2402, the second end panel 2404, and the fold mechanism 2406. The first end panel 2402, such as a panel, leaf, or board, can be formed from a non-conductive material having a rigid, a semi-pliable, a flexible, or a combination of characteristics thereof. The first end panel 2402 can include a predetermined thickness based on user requirements such as physical constraints, product features, or production needs. The second end panel 2404 can be similar to the first end panel 2402.

The fold mechanism 2406 such as a hinge, live-hinge, flexible section, indented section, or preformed region, can be formed in a variety of ways. For example, the fold mechanism 2406 can be formed as a discrete part, integral to the first end panel 2402, integral to the second end panel 2404, or combination thereof. In another example, the fold mechanism 2406 can have a flat surface on the back side.

The first end panel 2402 can include the first lanyard opening 2430 at the end of the first end panel 2402. The first lanyard opening 2430 can include a notch on the back side of the first end panel 2402. The second end panel 2404 can include the second lanyard opening 2432 at the end of the second end panel 2404. The second lanyard opening 2432 can include a notch on the back side of the second end panel 2404.

The first end panel 2402 can include the binder opening 2434 extending completely through the first end panel 2402. The binder opening 2434 can include beveled edges on both sides of the first end panel 2402. The beveled edges can be segmented, rounded, or a combination thereof.

The first end panel 2402 can include the binder notch 2436 extending from the binder opening 2434 to the outer first end panel side 2412. The binder notch 2436 is a gap in the material of the first end panel 2402.

The second end panel 2404 can include the clip mechanism 2438 formed from the material of the second end panel 2404. The clip mechanism 2438 is for attaching the system to a flat structure, such as a piece of paper, cardboard, or plastic.

The clip mechanism 2438 can have the angled tip 2442. The angled tip 2442 is bent outward away from the back side of the second end panel 2404. The angled tip 2442 can have an angle below the second end panel 2404 of between 0 and 45 degrees.

The foldable electrical connector-housing system 2400 can have a folded configuration with the back side of the first end panel 2402 and the back side of the second end panel 2404 in contact with one another. In another example, the back side of the first end panel 2402 and the back side of the second end panel 2404 can be facing one another.

Figure 26:
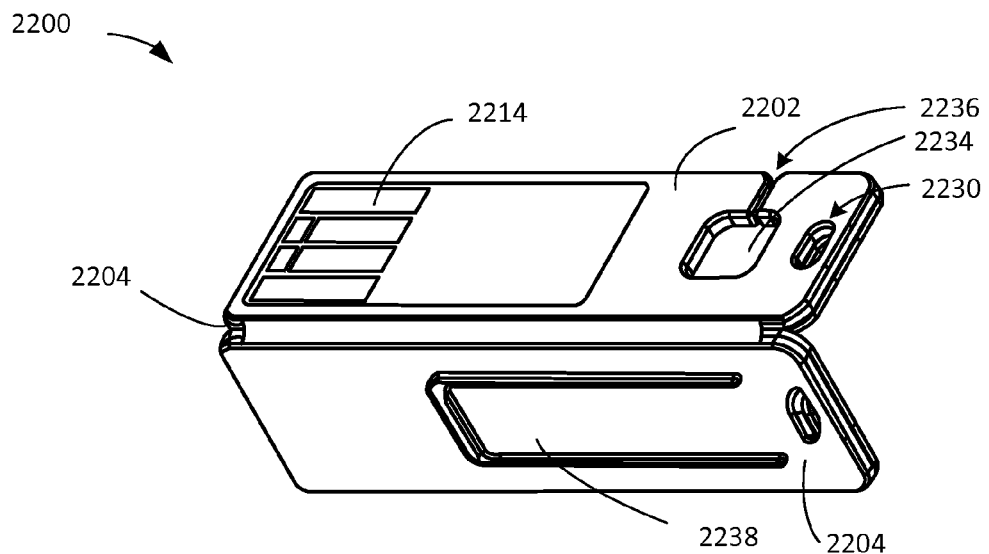
FIG. 26 is a perspective view of the foldable electrical connector-housing system in a partially folded configuration.

Referring now to FIG. 26, therein is shown a perspective view of the foldable electrical connector-housing system 2200 in a partially folded configuration. The first end panel 2202 can be folded relative to the second end panel 2204. The first end panel contacts 2214, the binder opening 2234, the first lanyard opening 2230, and the binder notch 2236 can be exposed from the first end panel 2202. The clip mechanism 2238, the second lanyard opening 2232 of FIG. 22 can be exposed from the second end panel 2204.

Figure 27:
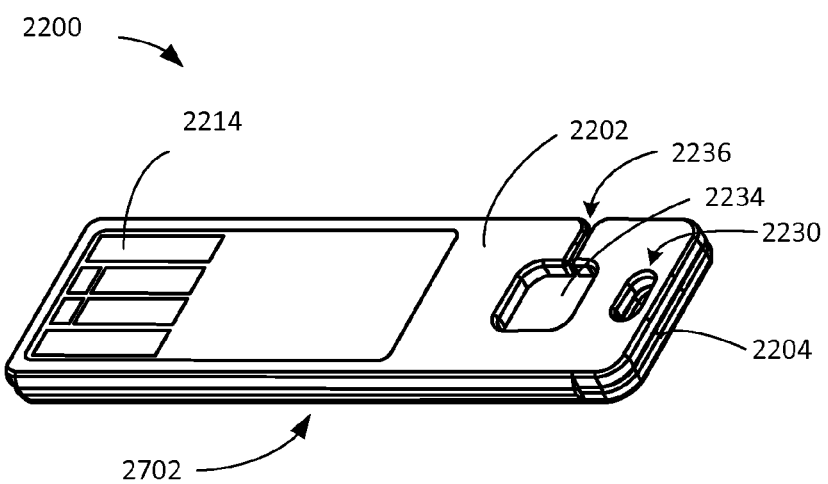
FIG. 27 is a perspective view of the foldable electrical connector-housing system in a folded configuration.

Referring now to FIG. 27, therein is shown a perspective view of the foldable electrical connector-housing system 2200 in a folded configuration 2702. The first end panel contacts 2214, the binder opening 2234, the first lanyard opening 2230, and the binder notch 2236 can be exposed from the first end panel 2202. The second end panel 2204 is in direct contact with the first end panel 2202.

Figure 28:
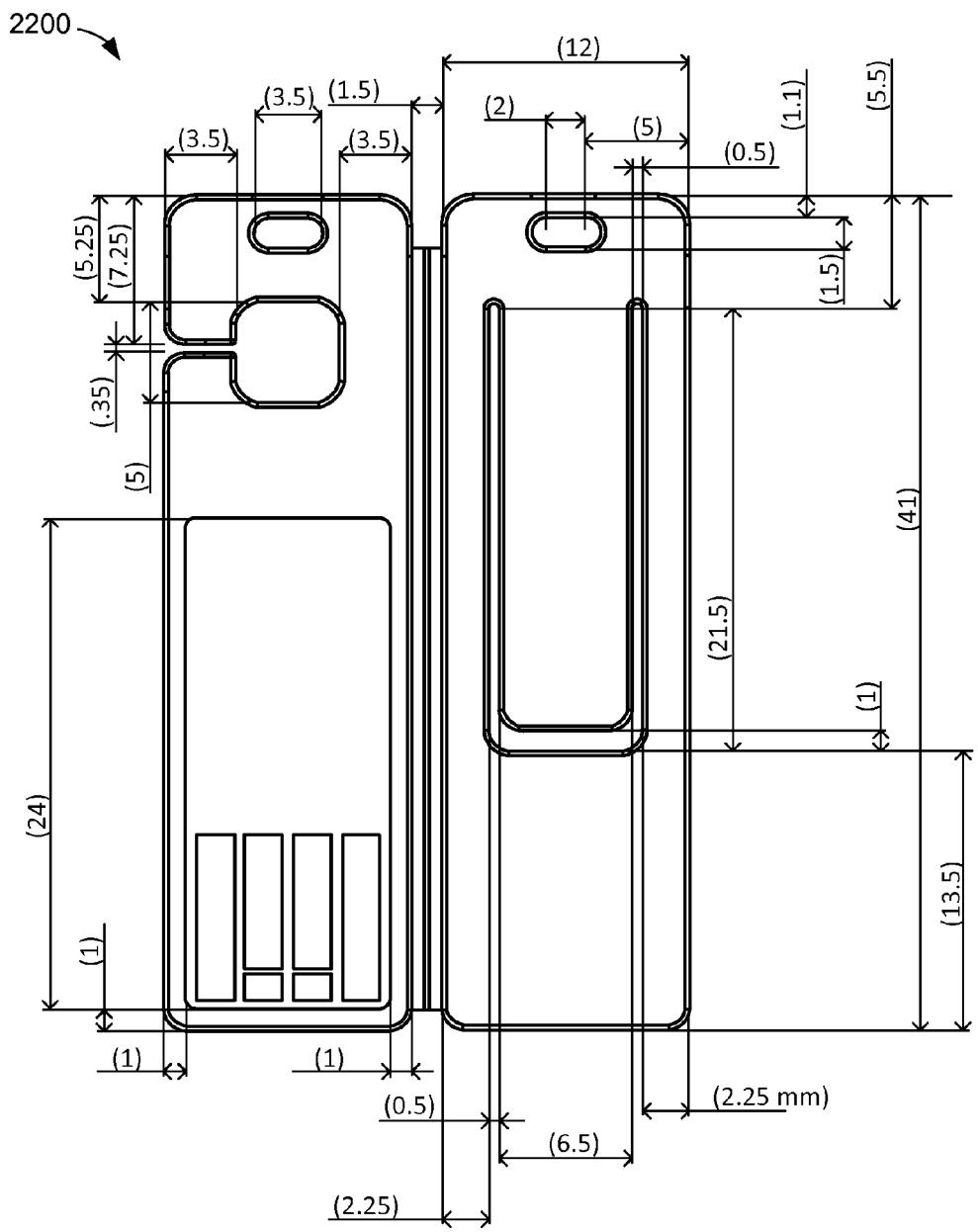
FIG. 28 is an example of a top view of the foldable electrical connector-housing system.

Referring now to FIG. 28, therein is shown an example of a top view of the foldable electrical connector-housing system 2200. The unfolded configuration can be used for showing the physical dimensions of the foldable electrical connector-housing system 2200. The physical dimensions are expressed as approximate values within normal engineering tolerances.

In an illustrative example, the foldable electrical connector-housing system 2200 can include the first end panel 2202 of FIG. 22 and the second end panel 2204 of FIG. 22. The first end panel 2202 and the second end panel 2204 can be 12 millimeters (mm) wide and 41 mm long. The first end panel 2202 and the second end panel 2204 can be 1.1 mm thick.

The foldable electrical connector-housing system 2200 can include the fold mechanism 2206 of FIG. 22 between the first end panel 2202 and the second end panel 2204. The fold mechanism 2206 can be 1.5 mm wide.

The first end panel 2202 can include the first lanyard opening 2230 of FIG. 22. The first lanyard opening 2230 can be 2 mm wide and 1.5 mm long. The second end panel 2204 can include the second lanyard opening 2232 of FIG. 22. The second lanyard opening 2232 can be 2 mm wide and 1.5 mm long. Each of the lanyard openings can be a total of 3.5 mm width to the full width.

The first end panel 2202 can include the binder opening 2234 of FIG. 22. The binder opening 2234 can be 5 mm wide and 5 mm long. The binder opening 2234 can be set off from the sides of the first end panel 2202 by 3.5 mm.

The first end panel 2202 can include the binder notch 2236 of FIG. 22 extending from the binder opening 2234 to the outer first end panel side 2212 of FIG. 22. The binder notch 2236 can extend 3.5 mm from the binder opening 2234 to the outer first end panel side 2212. The binder notch 2236 can be 0.35 mm wide. The binder notch 2236 can be set off from the end of the first end panel 2202 by 7.25 mm.

The second end panel 2204 can include the clip mechanism 2238 of FIG. 22. The clip mechanism 2238 can be 6.5 mm wide and 20.5 mm long. The second end panel 2204 can include the clip opening 2240 of FIG. 22. The clip opening 2240 can be a "U" shaped gap in the second end panel 2204 that is 0.5 mm on the long side of the clip mechanism 2238 and 1 mm on the tip of the clip mechanism 2238. The clip opening 2240 can also be 6.5 mm wide and 21.5 mm long. The clip opening 2240 can be set off from the end of the second end panel 2204 by 13.5 mm. The clip opening 2240 can be set off from the second lanyard opening 2232 by 5.5 mm.

The foldable electrical connector-housing system 2200 can include the electronic unit 2244 of FIG. 22. The electronic unit 2244 can be 10 mm wide and 24 mm long.

The dimensions of the foldable electrical connector-housing system 2200 can correspond to the dimensions of a USB device. The foldable electrical connector-housing system 2200 can be approximately 2 mm thick in the folded configuration.

Figure 29:
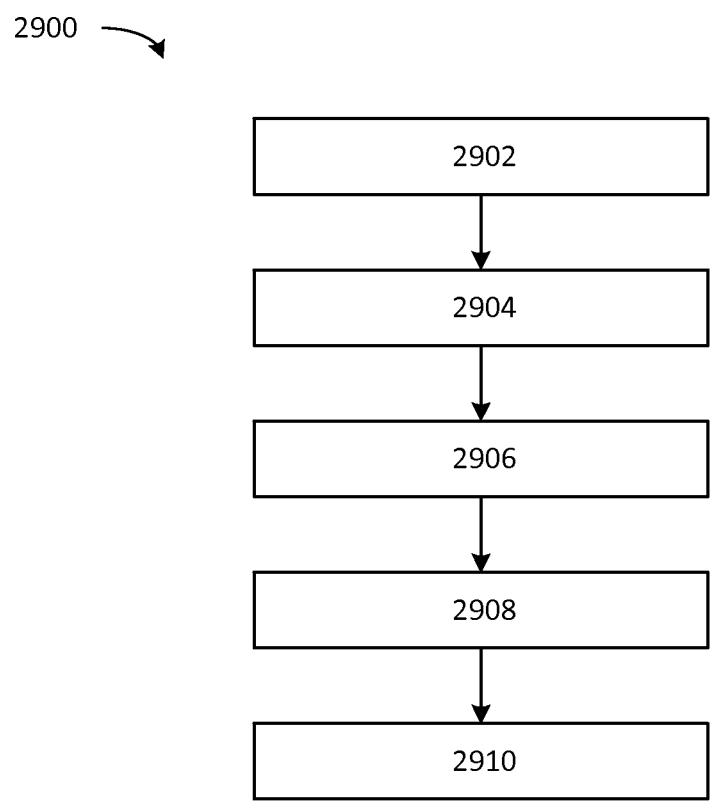
FIG. 29 is a flow chart of a method of manufacture of a foldable electrical connector-housing system in a further embodiment of the present invention.

Referring now to FIG. 29, therein is shown a flow chart of a method 2900 of manufacture of a foldable electrical connector-housing system in a further embodiment of the present invention. The method 2900 includes providing a first end panel with an outer first end panel side having first end panel contacts in a block 2902; providing a second end panel having an outer second end panel side in a block 2904; forming a clip mechanism in at least one of the two end panels for attaching the foldable electrical connector-housing system to a flat surface in a block 2906; providing a fold mechanism connected between the first end panel and the second end panel for folding into a folded configuration in a block 2908; and attaching an electronic unit on the first end panel, the electronic unit coupled to the first end panel contacts in a block 2910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A foldable electrical connector-housing system comprising:
   a first end panel with an outer first end panel side having first end panel contacts;
   a second end panel having an outer second end panel side;
   a clip mechanism in at least one of the two end panels for attaching the foldable electrical connector-housing system to a flat surface;
   a fold mechanism connected between the first end panel and the second end panel for folding into a folded configuration;
   an electronic unit on the first end panel, the electronic unit coupled to the first end panel contacts, wherein:
   the outer first end panel side is exposing the first end panel contacts and the outer second end panel side is exposing the clip mechanism in the folded configuration; and
   a memory device on the first end panel coupled to the first end panel contacts.

2. The system as claimed in claim 1 wherein the foldable electrical connector-housing system has a length versus width in a ratio of between 1.4 and 1.62 inclusive.

3. The system as claimed in claim 1 wherein the first end panel includes a binder opening and a binder notch for attaching the first end panel to a binder.

4. The system as claimed in claim 1 wherein the first end panel includes a first lanyard opening and a second lanyard opening for attaching to a lanyard.

5. The system as claimed in claim 1 wherein the clip mechanism includes an angled tip angled above the second end panel between 0 and 45 degrees.

6. The system as claimed in claim 1 wherein the fold mechanism is folded 180 degrees onto the second end panel for inserting into an external system.

7. The system as claimed in claim 1 wherein the memory device and the first end panel contacts are configured for operating as a universal serial bus (USB) device.

8. The system as claimed in claim 1 wherein the fold mechanism is for unfolding the foldable electrical connector-housing system from the folded configuration to an unfolded configuration.

9. The system as claimed in claim 1 wherein the memory device is configured as a Chip-on-Board.

* * * * *